US011081162B1

(12) United States Patent
Puthenthermadam et al.

(10) Patent No.: US 11,081,162 B1
(45) Date of Patent: Aug. 3, 2021

(54) SOURCE SIDE PRECHARGE AND BOOSTING IMPROVEMENT FOR REVERSE ORDER PROGRAM

(71) Applicant: SanDisk Technologies LLC, Addison, TX (US)

(72) Inventors: Sarath Puthenthermadam, San Jose, CA (US); Yu-Chung Lien, San Jose, CA (US); Huai-Yuan Tseng, San Ramon, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/798,718

(22) Filed: Feb. 24, 2020

(51) Int. Cl.
| | |
|---|---|
| *G11C 16/04* | (2006.01) |
| *G11C 11/4074* | (2006.01) |
| *G11C 11/4094* | (2006.01) |
| *G11C 5/14* | (2006.01) |
| *G11C 7/14* | (2006.01) |
| *G11C 5/02* | (2006.01) |
| *G11C 11/408* | (2006.01) |

(52) U.S. Cl.
CPC .......... *G11C 11/4074* (2013.01); *G11C 5/025* (2013.01); *G11C 5/146* (2013.01); *G11C 7/14* (2013.01); *G11C 11/4085* (2013.01); *G11C 11/4094* (2013.01); *G11C 16/04* (2013.01)

(58) Field of Classification Search
CPC ................................................ G11C 16/0483
USPC ................................................ 365/185.17
See application file for complete search history.

(56) References Cited

U.S. PATENT DOCUMENTS

| | | |
|---|---|---|
| 7,259,991 B2 | 8/2007 | Aritome |
| 7,889,560 B2 | 2/2011 | Guterman |
| 8,472,254 B2 | 6/2013 | Roohparvar |
| 8,630,775 B2 | 1/2014 | Kitaori et al. |
| 8,804,416 B2 | 8/2014 | Goda |
| 8,947,934 B2 | 2/2015 | Yip |
| 9,236,128 B1 | 1/2016 | Louie et al. |
| 9,460,792 B2 | 10/2016 | Pan et al. |
| 9,589,644 B2 | 3/2017 | Yip |
| 9,589,660 B1 * | 3/2017 | Hashimoto ....... H01L 27/11582 |
| 9,620,238 B2 | 4/2017 | Khandeiwai et al. |
| 9,640,273 B1 | 5/2017 | Chen et al. |
| 10,354,737 B2 | 7/2019 | Hu |

(Continued)

FOREIGN PATENT DOCUMENTS

JP 2010518538 A 5/2010

*Primary Examiner* — Jason Lappas
(74) *Attorney, Agent, or Firm* — Vierra Magen Marcus LLP

(57) ABSTRACT

This disclosure relates to apparatuses and a method for retaining a bias in a NAND string channel during source-side precharge. The apparatuses include a memory array and a die controller configured to mitigate formation of a potential gradient in the channel of the memory array NAND strings during a program storage operation. To this end, a plurality of source-side select gates is activated, then each of the plurality of source side dummy word line select gates is activated. Next, a NAND string channel is biased by biasing the source line coupled to the NAND string by the plurality of source-side select gates. Finally, the plurality of source-side select gates and the plurality of source side dummy word line select gates are discharged such that the channel maintains an electrical path to the source line.

20 Claims, 17 Drawing Sheets

(56) References Cited

U.S. PATENT DOCUMENTS

| | | |
|---|---|---|
| 2010/0322006 A1 | 12/2010 | Kwan et al. |
| 2012/0081962 A1 | 4/2012 | Tsai et al. |
| 2014/0347934 A1 | 11/2014 | Goda |
| 2015/0221385 A1 | 8/2015 | Ahn et al. |
| 2016/0336071 A1 | 11/2016 | Park et al. |
| 2017/0117049 A1 | 4/2017 | Rajwade et al. |
| 2019/0295669 A1 | 9/2019 | Yang et al. |
| 2019/0304549 A1 | 10/2019 | Yang et al. |

* cited by examiner

SOURCE SIDE PRECHARGE AND BOOSTING IMPROVEMENT FOR REVERSE ORDER PROGRAM

BACKGROUND

In three-dimensional memory array solutions, reverse order programming (ROP) may be used to program a series of word lines starting with a word line closest to the drain side of the memory array and proceeding sequentially to subsequent word lines, each closer to the source side of the array. This is in contrast to normal order programming (NOP) methods, which begin programming source side word lines and proceed toward the drain side. "Word line" refers to a structure within a memory array comprising a set of memory cells. The memory array is configured such that the operational memory cells of the word line are read or sensed during a read operation. Similarly, the memory array is configured such that the operational memory cells of the word line are programmed, or written to, during a write/program operation.

For example, in a memory array with 96 word lines, the word line closest to the source side of the array may be referred to as WL0, and the word line closest to the drain side may then be WL95. In NOP methods, programming would begin with WL0 and proceed to WL1, WL2, etc., until WL95 is reached. Thus, in ROP methods of programming, WL95 is the first word line programmed, then WL94, WL93, etc., until WL0 is reached.

ROP methods provide a tighter distribution of memory states. That is, for a memory cell capable of being programmed to multiple memory states, a threshold voltage determines which state the memory cell is programmed to. "Threshold voltage" refers to a voltage level that when applied to a gate terminal of a transistor causes the transistor to conduct a current between the drain terminal and source terminal.

For example, in flash memory cells in which each memory cell comprises a transistor having a source terminal, a drain terminal, and a gate terminal, the determinable characteristic is a voltage level that when applied to the gate terminal causes the memory cell to conduct a current between the drain and the source terminals. A threshold voltage may also be referred to as a control gate reference voltage (CGRV), read voltage, or reference voltage.

NOP methods result in a broader distribution curve of threshold voltages among cells programmed to the same state, meaning more cells may be programmed to a threshold voltage near an edge or boundary of what may be considered the correct state. A tighter distribution resulting from ROP methods means cells are more tightly grouped around a threshold voltage value, which may result in a lower bit error rate because fewer cells may be erroneously read as part of a different state.

However, ROP has some drawbacks. While the distribution of threshold voltages for programmed memory states is tighter, giving a lower bit error rate, the threshold voltage distribution for the erased state is broader. Specifically, the erase state distribution has a wider upper tail. That is, a higher number of erased cells exhibit a higher than expected threshold voltage, such that cells in the erased state may be more frequently read as being in a programmed state. This is particularly true for memory cells in lower word lines (i.e., WL0, WL1, etc., residing closer to the source side). This problem may result from a source side precharging mechanism used by ROP methods.

For both NOP and ROP methods, there is a precharge stage before programming, during which the channels of NAND strings in the array receive a precharge voltage. All unprogrammed word lines are turned on and a positive voltage is passed through to the channel. This helps with inhibiting unselected word lines not intended for programming during a programming stage. During programming, unselected word lines are inhibited by boosting them to a higher voltage potential, and the precharge stage allows this boost to begin at a higher potential rather than having to boost up from a lower or zero potential.

NOP precharging is performed by placing a potential on the drain side of the NAND strings. Because word lines already programmed will be on the source side of the memory array, these programmed word lines could prevent a potential on the source side from charging the channels beneath word lines about to be programmed. For ROP, the opposite is true, so the precharge voltage boost is applied to the source side. This source side precharge may cause or contribute to the erase upper tail observed when ROP is used, as discussed above. Thus, there is a need to counteract the causes of the wider erase upper tail incurred by ROP programming methods in order to leverage its benefits.

BRIEF SUMMARY

This disclosure relates to an apparatus comprising a three-dimensional memory array of NAND strings and a die controller. Each NAND string comprises a source-side select gate, a drain-side select gate, a set of memory cells, and a channel. The source-side select gate on the source side of the NAND string is configured to couple the NAND string to a source line. The drain-side select gate on the drain side of the NAND string is configured to couple the NAND string to a bit line. The set of memory cells is positioned along the NAND string between the source-side select gate and the drain-side select gate. Each memory cell is coupled to a word line. The channel extends from the source side to the drain side of the NAND string. The die controller is configured to mitigate formation of a potential gradient in the channel of the NAND strings during a program storage operation precharge stage.

This disclosure further relates to an apparatus comprising a three-dimensional memory array of NAND strings, each coupled to a bit line. The apparatus further comprises a plurality of drain control lines connected to the drain side of each NAND string and a plurality of source control lines connected to the source side of each NAND string. The apparatus also includes a plurality of word lines comprising memory cells that are positioned between the drain control lines and source control lines. The apparatus further comprises a plurality of drain side dummy word lines coupled to each NAND string between the drain control lines and the word lines, as well as a plurality of source side dummy word lines coupled to each NAND string between the source control lines and the word lines. The apparatus includes a source line coupled to the source side of each NAND string. Finally, the apparatus includes a die controller configured to precharge and boost a voltage within each NAND string of an unselected memory cell along a selected word line. In this manner, the unselected memory cell is inhibited from programming.

Finally, this disclosure relates to a method for retaining a bias in a NAND string channel during source-side precharge. First, a plurality of source-side select gates is activated (biased). The source-side select gates are coupled between a source line and a plurality of source side dummy word line select gates. The source side dummy word line select gates are adjacent to a memory cell of the NAND string that is coupled to a word line. Next, each of the plurality of source side dummy word line select gates is activated (biased). A NAND string channel is then biased by biasing the source line coupled to the NAND string by the plurality of source-side select gates. Finally, the plurality of source-side select gates and the plurality of source side dummy word line select gates are discharged such that the channel maintains an electrical path to the source line.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
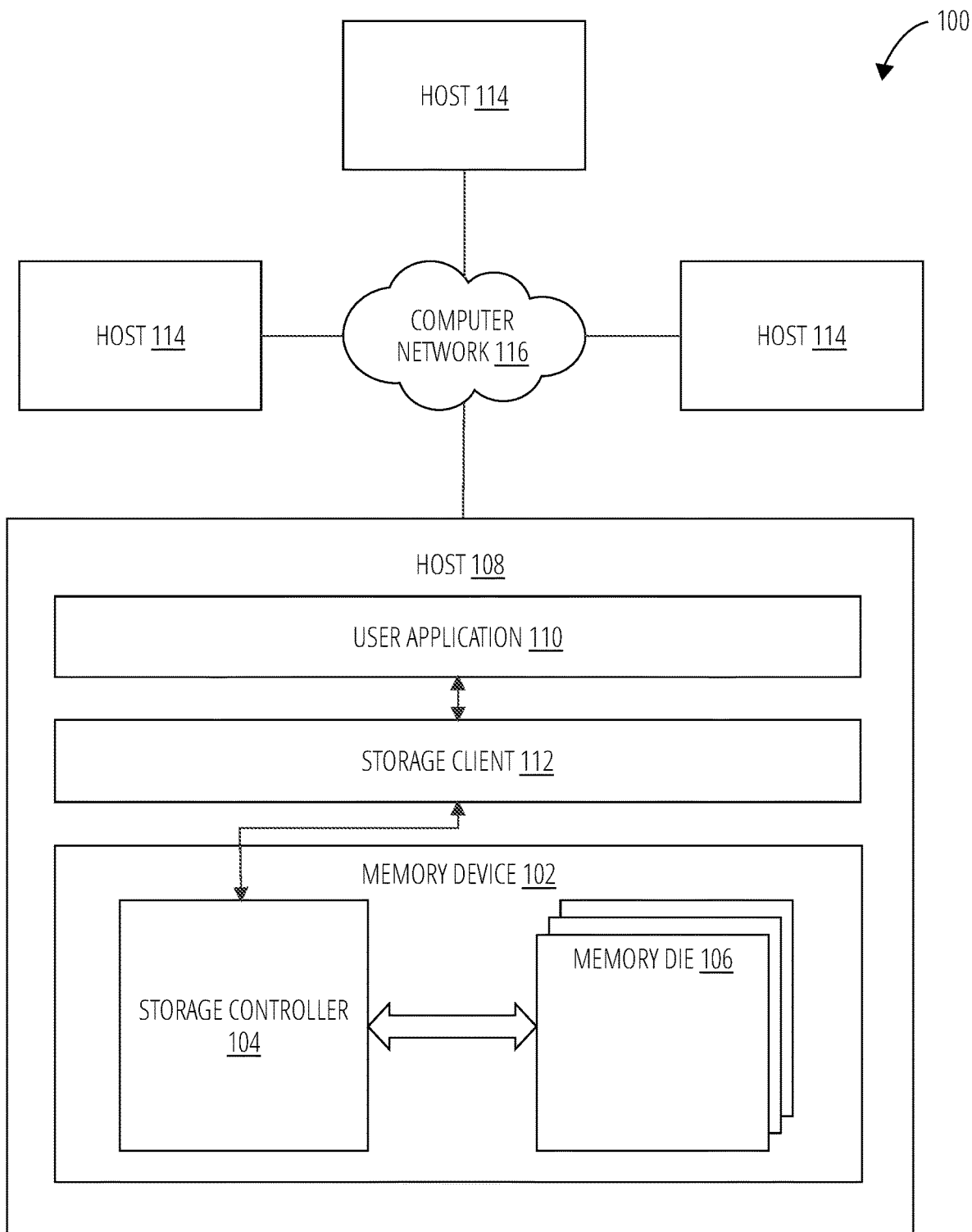
FIG. 1 illustrates a system 100 in accordance with one embodiment.

At the end of the precharge stage for ROP programming, the source-side select gate or gates may be cut off, removing the positive potential applied to the channel. The precharge stage raises the potential in the channel in order to improve a boosting voltage in the channel needed to inhibit cells that are intended to remain in the erase state. Because the source-side select gate or gates turn off, the channel is isolated (e.g., the channel floats). If certain source-side select gates are still discharging when the channel is cut-off from the source line this may causes a negative coupling effect on the precharge potential within the channel. The negative coupling effect may remove the potential built up by the precharge stage, particularly for memory cell closest to the control lines causing the negative coupling effect. Thus, operations, such as boosting, to inhibit programming may inadequately prevent cells in an erased state from exhibiting a higher threshold voltage after programming is complete. As a result, these memory cells may unintentionally incur a change in threshold voltage (e.g., a program disturb) that places them in a programmed state instead of remaining in an erased state.

"Precharge stage" refers to a stage within a program storage operation. A precharge stage is a specific stage configured to raise a channel potential (e.g. Voltage) for the NAND strings of a memory array. The precharge stage may supply a voltage (e.g., bias; referred to herein as a channel precharge voltage) to raise the channel potential from either side of the NAND strings.

In one embodiment, a die controller implements a precharge stage from the source side of the NAND strings (memory array). This type of precharge stage is referred to herein as a source-side precharge stage. In a source-side precharge stage, the die controller may activate each select gate on the source side and each dummy word line on the source side. This may be done by sending a voltage on the control lines of the each of the source side select gates that exceeds a threshold voltage of the select gates. The die controller also sends a channel precharge voltage on a source line that connects to each NAND string. Once the channel precharge voltage has been supplied for a sufficient time period, voltage on the source side select gates is discharged such that the channel is cut off from the source line and the channel floats.

"Select gate" refers to a transistor structurally and/or electrically configured to function as a switch to electrically connect a first electrical structure connected to a source terminal of the transistor to a second electrical structure connected to the drain terminal. When functioning as a switch, the transistor is referred to herein as a 'select gate' and serves to gate (selectively) or control when, and in what quantity, a current flows or a voltage passes between the first electrical structure and the second electrical structure. Depending on the context, references to select gate herein may refer to the whole transistor or to the gate terminal of the transistor.

"Transistor" refers to an electronic component configured to serve as a signal amplifier or as an electronic switch. A transistor comprises a gate terminal, a source terminal, a drain terminal, and a body terminal or just a body. A transistor may comprise a discrete electronic or semiconductor component or may comprise structures or portions of structures or devices embedded in an integrated circuit or semiconductor component or semiconductor device.

A transistor operating as a switch is configured such that the source terminal electrically connects to a first electrical structure and the drain terminal electrically connects to a second electrical structure. In a switch configuration, a gate terminal of the transistor connects to a control line. The transistor is activated by increasing a voltage on the control line to, or above, a threshold voltage and deactivated by decreasing the voltage on the control line below a threshold voltage. Activation of a transistor by way of the control line is referred to herein as placing the transistor in a on state.

Activation of the transistor forms an electrically conductive path and/or causes the transistor to conduct a current and/or permit a voltage, or bias, to transfer between the source terminal and the drain terminal.

"Potential gradient" refers to a change in an electrical or magnetic field or potential, such as a voltage, within a conducting body. Specifically, a potential gradient is a change in the potential between a first portion of the conducting body and a second portion of the conducting body.

Those of skill in the art recognize that if the potential gradient is analogous to a slope of a line on a graph (electrical/magnetic potential on x-axis, position within the conducting body on the y-axis) and that when depicted visually a line with a greater slope represents a greater potential gradient and a line with a gradual or no slope represents a smaller potential gradient or no potential gradient. A higher potential gradient means that electrons, or holes, within an electrical or magnetic field or potential represented by the potential gradient may accelerate through the conductive body to reach a state of equilibrium. Similarly, a lower or no potential gradient means that electrons, or holes, within an electrical or magnetic field or potential represented by the potential gradient may decelerate through the conductive body with the lower potential gradient.

The apparatuses and methods disclosed herein relate to adjustments in how the source-side select gate is turned off at the end of a precharge stage and specifically how the channel is electrically decoupled from a bias source. These changes in source-side select gate management may reduce the potential gradient incurred or may counteract the effects of this potential gradient as experienced during the programming stage, as described below.

FIG. 1 is a schematic block diagram illustrating one embodiment of a system 100 for improving performance in a solid-state storage device in accordance with the claimed solution(s). The system 100 includes a memory device 102, a host 108, one or more hosts 114, and a computer network 116, which are described below.

The system 100 includes at least one memory device 102, comprising a storage controller 104 and one or more memory die 106. "Storage controller" refers to a hardware, device, component, element, or circuit configured to manage data operations on non-volatile memory media, and may comprise one or more processors, programmable processors (e.g., FPGAs), ASICs, micro-controllers, or the like. In some embodiments, the storage controller is configured to store data on and/or read data from non-volatile memory media, to transfer data to/from the non-volatile memory device(s), and so on.

"Memory die" refers to a small block of semiconducting material on which a given functional circuit is fabricated. Typically, integrated circuits are produced in large batches on a single wafer of electronic-grade silicon (EGS) or other semiconductor (such as GaAs) through processes such as photolithography. The wafer is cut (diced) into many pieces, each containing one copy of the circuit. Each of these pieces is called a die. (Search "die" on Wikipedia.com Oct. 9, 2019. Accessed Nov. 18, 2019.)

In some embodiments, the system 100 may include two or more memory devices. Each memory device 102 may include one or more memory die 106, such as flash memory, nano random-access memory ("nano RAM or NRAM"), magneto-resistive RAM ("MRAM"), dynamic RAM ("DRAM"), phase change RAM ("PRAM"), etc. In further embodiments, the data memory device 102 may include other types of non-volatile and/or volatile data storage, such as dynamic RAM ("DRAM"), static RAM ("SRAM"), magnetic data storage, optical data storage, and/or other data storage technologies. The memory device 102 is described in more detail with respect to FIG. 2.

The memory device 102, also referred to herein as a storage device, may be a component within a host 108 as depicted in here, and may be connected using a system bus, such as a peripheral component interconnect express ("PCIe") bus, a Serial Advanced Technology Attachment ("serial ATA") bus, or the like. "Host" refers to a computing device or computer device or computer system configured to send and receive storage commands. Examples of a host include, but are not limited to, a computer, a laptop, a mobile device, an appliance, a virtual machine, an enterprise server, a desktop, a tablet, a main frame, and the like. In another embodiment, the memory device 102 is external to the host 108 and is connected, a universal serial bus ("USB") connection, an Institute of Electrical and Electronics Engineers ("IEEE") 1394 bus ("FireWire"), or the like. In other embodiments, the memory device 102 is connected to the host 108 using a peripheral component interconnect ("PCI") express bus using external electrical or optical bus extension or bus networking solution such as Infiniband or PCI Express Advanced Switching ("PCIe-AS"), or the like.

In various embodiments, the memory device 102 may be in the form of a dual-inline memory module ("DIMM"), a daughter card, or a micro-module. In another embodiment, the memory device 102 is a component within a rack-mounted blade. In another embodiment, the memory device 102 is contained within a package that is integrated directly onto a higher level assembly (e.g., mother board, laptop, graphics processor). In another embodiment, individual components comprising the memory device 102 are integrated directly onto a higher level assembly without intermediate packaging.

In a further embodiment, instead of being connected directly to the host 108 as DAS, the data memory device 102 may be connected to the host 108 over a data network. For example, the data memory device 102 may include a storage area network ("SAN") storage device, a network attached storage ("NAS") device, a network share, or the like. In one embodiment, the system 100 may include a data network, such as the Internet, a wide area network ("WAN"), a metropolitan area network ("MAN"), a local area network ("LAN"), a token ring, a wireless network, a fiber channel network, a SAN, a NAS, ESCON, or the like, or any combination of networks. A data network may also include a network from the IEEE 802 family of network technologies, such Ethernet, token ring, Wi-Fi, Wi-Max, and the like. A data network may include servers, switches, routers, cabling, radios, and other equipment used to facilitate networking between the host 108 and the data memory device 102.

The system 100 includes at least one host 108 connected to the memory device 102. Multiple hosts may be used and may comprise a host, a server, a storage controller of a storage area network ("SAN"), a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. In another embodiment, a host 108 may be a client and the memory device 102 operates autonomously to service data requests sent from the host 108. In this embodiment, the host 108 and memory device 102 may be connected using a computer network, system bus, Direct Attached Storage (DAS) or other communication means suitable for connection between a computer and an autonomous memory device 102.

The depicted embodiment shows a user application 110 in communication with a storage client 112 as part of the host 108. In one embodiment, the user application 110 is a software application operating on or in conjunction with the storage client 112. The storage client 112 manages files and data and utilizes the functions and features of the storage controller 104 and associated memory die 106. Representative examples of storage clients include, but are not limited to, a server, a file system, an operating system, a database management system ("DBMS"), a volume manager, and the like. The storage client 112 is in communication with the storage controller 104 within the memory device 102.

In one embodiment, the system 100 includes one or more clients connected to one or more host 108 through one or more computer networks. A host 114 may be a host, a server, a storage controller of a SAN, a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. The computer network 116 may include the Internet, a wide area network ("WAN"), a metropolitan area network ("MAN"), a local area network ("LAN"), a token ring, a wireless network, a fiber channel network, a SAN, network attached storage ("NAS"), ESCON, or the like, or any combination of networks. The computer network 116 may also include a network from the IEEE 802 family of network technologies, such Ethernet, token ring, WiFi, WiMax, and the like.

The computer network 116 may include servers, switches, routers, cabling, radios, and other equipment used to facilitate networking the host 108 or host devices and host 114 or clients. In one embodiment, the system 100 includes multiple hosts that communicate as peers over a computer network 116. In another embodiment, the system 100 includes multiple memory devices 102 that communicate as peers over a computer network 116. One of skill in the art will recognize other computer networks comprising one or more computer networks and related equipment with single or redundant connection between one or more clients or other computer with one or more memory devices 102 or one or more memory devices 102 connected to one or more hosts. In one embodiment, the system 100 includes two or more memory devices 102 connected through the computer network 116 to a host 114 without a host 108.

In one embodiment, the storage client 112 communicates with the storage controller 104 through a host device interface comprising an Input/Output (I/O) interface. For example, the memory device 102 may support the ATA interface standard, the ATA Packet Interface ("ATAPI") standard, the small computer system interface ("SCSI") standard, and/or the Fibre channel standard which are maintained by the InterNational Committee for Information Technology Standards ("INCITS").

In certain embodiments, the storage media of a memory device is divided into volumes or partitions. Each volume or partition may include a plurality of sectors. Traditionally, a sector is 512 bytes of data. One or more sectors are organized into a block (referred to herein as both block and data block, interchangeably).

In one example embodiment, a data block includes eight sectors which is 4 KB. In certain storage systems, such as those interfacing with the Windows® operating systems, the data blocks are referred to as clusters. In other storage systems, such as those interfacing with UNIX, Linux, or similar operating systems, the data blocks are referred to simply as blocks. A block or data block or cluster represents a smallest physical amount of storage space on the storage media that is managed by a storage manager, such as a storage controller, storage system, storage unit, storage device, or the like.

In some embodiments, the storage controller 104 may be configured to store data on one or more asymmetric, write-once storage media, such as solid-state storage memory cells within the memory die 106. As used herein, a "write once" storage media refers to storage media that is reinitialized (e.g., erased) each time new data is written or programmed thereon. As used herein, an "asymmetric" storage media refers to a storage media having different latencies for different storage operations. Many types of solid-state storage media (e.g., memory die) are asymmetric; for example, a read operation may be much faster than a write/program operation, and a write/program operation may be much faster than an erase operation (e.g., reading the storage media may be hundreds of times faster than erasing, and tens of times faster than programming the storage media). "Program" refers to a storage operation in which a characteristic of a memory cell is changed from a first state (often, an erased state) to a second state. A program storage operation may also be referred to as a write operation herein.

In certain embodiments, a program storage operation may include a series of iterations that incrementally change the characteristic until at least a target level of change is achieved. In other embodiments, a program storage operation may cause the attribute to change to a target level with a single iteration.

"Program storage operation" refers to a storage operation in which a characteristic of a memory cell is changed from a first state (often, an erased state) to a second state. A program storage operation may also be referred to as a write operation herein. "Storage operation" refers to an operation performed on a memory cell to change the value of data represented by a state characteristic of the memory cell. In certain embodiments, a storage operation may include a series of steps that are performed in sequential order to complete the storage operation. Examples of storage operations include but are not limited to reading data from a memory cell, writing (or programming) data to a memory cell, and/or erasing data stored in a memory cell.

The memory die 106 may be partitioned into memory divisions that can be erased as a group (e.g., erase blocks) in sequential order to, inter alia, account for the asymmetric properties of the memory die 106 or the like. As such, modifying a single data segment in-place may require erasing the entire erase block comprising the data, and rewriting the modified data to the erase block, along with the original, unchanged data. This may result in inefficient "write amplification," which may excessively wear the memory die 106. Therefore, in some embodiments, the storage controller 104 may be configured to write data out-of-place.

As used herein, writing data "out-of-place" refers to writing data to different media storage location(s) rather than overwriting the data "in-place" (e.g., overwriting the original physical location of the data). Modifying data out-of-place may avoid write amplification, since existing, valid data on the erase block with the data to be modified need not be erased and recopied. Moreover, writing data out-of-place may remove erasure from the latency path of many storage operations (e.g., the erasure latency is no longer part of the critical path of a write operation).

Management of a data block by a storage manager includes specifically addressing a particular data block for a read operation, write operation, or maintenance operation. A block storage device may associate n blocks available for user data storage across the storage media with a logical address, numbered from 0 to n. In certain block storage devices, the logical addresses may range from 0 to n per volume or partition. In conventional block storage devices, a logical address, also referred to as a logical block address (LBA), maps directly to a particular data block on physical storage media. In conventional block storage devices, each data block maps to a particular set of physical sectors on the physical storage media.

However, certain storage devices do not directly or necessarily associate logical addresses with particular physical data blocks. These storage devices may emulate a conventional block storage interface to maintain compatibility with a block storage client 112.

In one embodiment, the storage controller 104 provides a block I/O emulation layer, which serves as a block device interface, or API. In this embodiment, the storage client 112 communicates with the storage device through this block device interface. In one embodiment, the block I/O emulation layer receives commands and logical addresses from the storage client 112 in accordance with this block device interface. As a result, the block I/O emulation layer provides the storage device compatibility with a block storage client 112.

In one embodiment, a storage client 112 communicates with the storage controller 104 through a host device interface comprising a direct interface. In this embodiment, the storage device directly exchanges information specific to non-volatile storage devices. A storage device using direct interface may store data in the memory die 106 using a variety of organizational constructs including, but not limited to, blocks, sectors, pages, logical blocks, logical pages, erase blocks, logical erase blocks, ECC codewords, logical ECC codewords, or in any other format or structure advantageous to the technical characteristics of the memory die 106.

The storage controller 104 receives a logical address and a command from the storage client 112 and performs the corresponding operation in relation to the memory die 106. The storage controller 104 may support block I/O emulation, a direct interface, or both.

Figure 2:
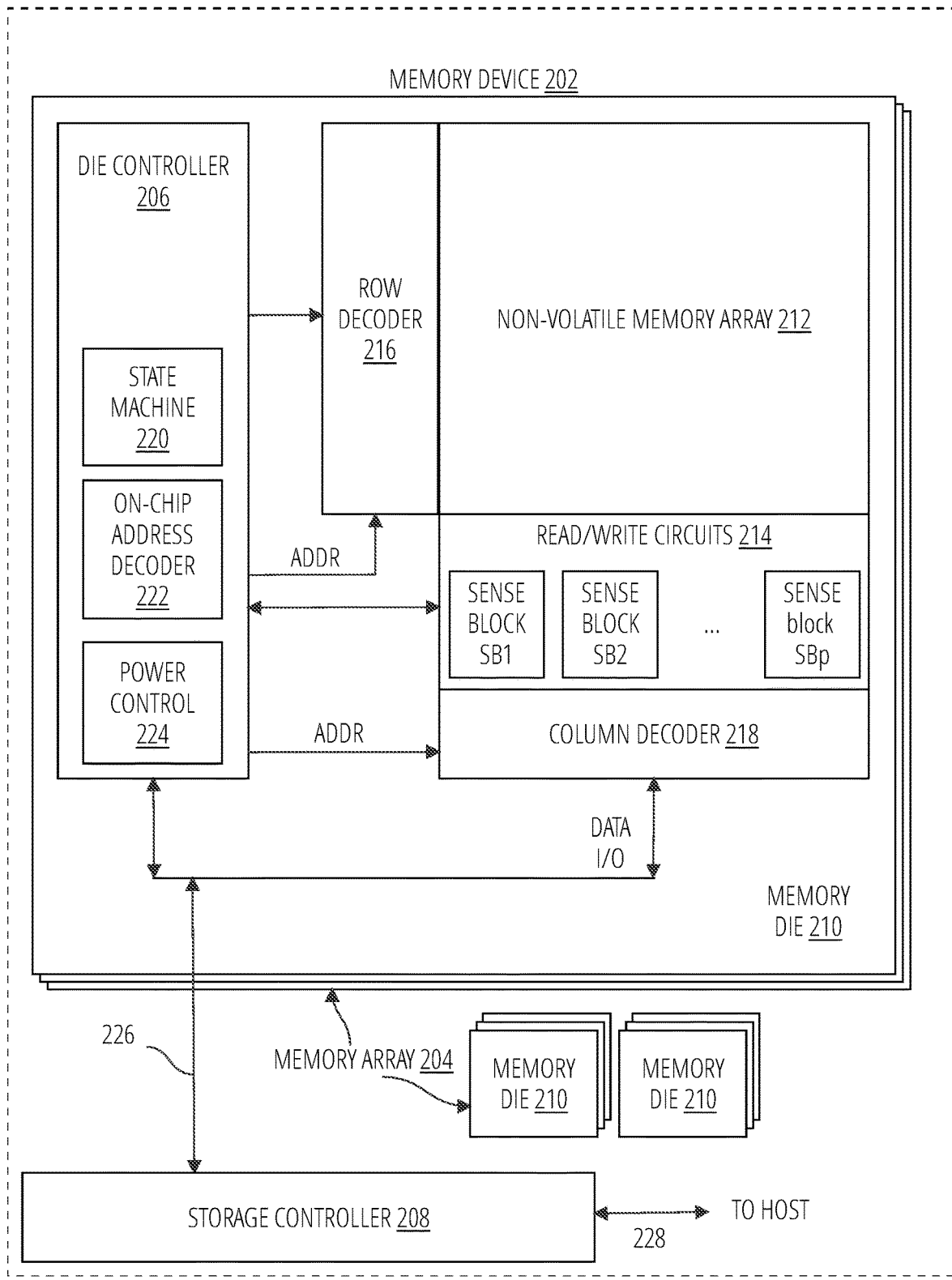
FIG. 2 is a block diagram of an example memory device 202 in one embodiment.

FIG. 2 is a block diagram of an exemplary memory device 202. The memory device 202 may include a storage controller 208 and a memory array 204. Each memory die 210 may include a die controller 206 and at least one non-volatile memory array 212 in the form of a three-dimensional memory array, and read/write circuits 214.

"Non-volatile memory media" refers to any hardware, device, component, element, or circuit configured to maintain an alterable physical characteristic used to represent a binary value of zero or one after a primary power source is removed. "Non-volatile memory" refers to a shorthand name for non-volatile memory media. In certain embodiments, non-volatile memory media refers to the non-volatile memory media and the logic, controllers, processor(s), state machine(s), and/or other periphery circuits that manage the non-volatile memory media and provide access to the non-volatile memory media.

"Logic" refers to machine memory circuits, non-transitory machine readable media, and/or circuitry which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

"Memory array" refers to a set of memory cells (also referred to as storage cells) organized into an array structure having rows and columns. Consequently, a non-volatile memory array is a memory array having memory cells configured such that a characteristic (e.g., threshold voltage level, resistance level, conductivity, etc.) of the memory cell used to represent stored data remains a property of the memory cell without a requirement for a power source to maintain the characteristic.

A memory array is addressable using a row identifier and a column identifier. Those of skill in the art recognize that a memory array may comprise the set of memory cells within a plane, the set of memory cells within a memory die, the set of memory cells within a set of planes, the set of memory cells within a set of memory die, the set of memory cells within a memory package, the set of memory cells within a set of memory packages, or with other known memory cell set architectures and configurations.

A memory array may include a set of memory cells at a number of levels of organization within a storage or memory system. In one embodiment, memory cells within a plane may be organized into a memory array. In one embodiment, memory cells within a plurality of planes of a memory die may be organized into a memory array. In one embodiment, memory cells within a plurality of memory dies of a memory device may be organized into a memory array. In one embodiment, memory cells within a plurality of memory devices of a storage system may be organized into a memory array.

"Non-volatile memory array" refers to a set of non-volatile storage cells (also referred to as memory cells or non-volatile memory cells) organized into an array structure having rows and columns. A memory array is addressable using a row identifier and a column identifier.

"Memory cell" refers to a type of storage media configured to represent one or more binary values by way of a determinable characteristic of the storage media when the storage media is sensed, read, or detected to determine a binary value(s) stored, or represented by, the determinable characteristic of the memory cell. Storage cell and memory cell are used interchangeably herein.

The type of determinable characteristic used to store data in a memory cell may vary depending on the type of memory or storage technology used. For example, in flash memory cells in which each memory cell comprises a transistor having a source lead, a drain lead, and a gate, the determinable characteristic is a voltage level that when applied to the gate causes the memory cell to conduct a current between the drain and the source leads. The voltage level, in this example, is referred to herein as a threshold voltage. A threshold voltage may also be referred to as a control gate reference voltage (CGRV), read voltage, or reference voltage.

Examples of the determinable physical characteristic include, but are not limited to, a threshold voltage for a transistor, an electrical resistance level of a memory cell, a current level through a memory cell, a magnetic pole orientation, a spin-transfer torque, and the like.

"Three-dimensional memory array" refers to a physical arrangement of components of a memory array which contrasts with a two-dimensional (2-D) memory array. 2-D memory arrays are formed along a planar surface of a semiconductor wafer or other substrate. A three-dimensional (3-D) memory array extends up from the wafer surface/ substrate and generally includes stacks, or columns, of memory cells extending upwards, in a z-direction. In a 3-D memory array word lines comprise layers stacked one on the other as the memory array extends upwards. Various 3-D arrangements are possible. In one arrangement a NAND string is formed vertically with one end (e.g., source) at the wafer surface and the other end (e.g., drain) on top.

The non-volatile memory array 212 is addressable by word line via a row decoder 216 and by bit line via a column decoder 218. "Bit line" refers to a circuit structure configured to deliver a voltage and/or conduct current to a column of a memory array. In one embodiment, the column comprises a NAND string, also referred to as channel. In one embodiment, a bit line connects to a NAND string at a drain end of the NAND string. A memory array may have one bit line for each memory cell along the word lines of the memory array.

The read/write circuits 214 include multiple sense blocks SB1, SB2, . . . , SBp (sensing circuitry) and allow a page of memory cells to be read or programmed in parallel. In certain embodiments, a sense block comprises a sense circuit. "Sense circuit" refers to a circuit, sub-circuit, electronic component, hardware, software, firmware, module, logic, device, or apparatus configured, programmed, designed, arranged, or engineered to determine a memory state for a memory cell coupled to the sense circuit. A sense circuit may be referred to as a sense amplifier or sense amp herein and may or may not include one or more sense amplifiers.

In one embodiment, a sense circuit determines whether a memory cell coupled to the sense circuit conducts a current in response to certain bias voltages applied to a selected word line, to unselected word lines, one or more bit line, and to a bit line coupled to the sense circuit. Given a certain reference voltage applied to a selected word line, the sense circuit determines whether a memory cell coupled to the selected word line conducts at the reference voltage. This determination is referred to herein as a sense operation. If the memory cell does conduct, this helps to determine the memory state of the memory cell. In certain embodiments, a plurality of reference voltages and a plurality of sense/read operations is performed to determine a memory state for a memory cell. Sense operations may be performed during a read storage operation and during a program storage operation to confirm/verify that a memory state of a memory cell has reached a target memory state. In certain embodiments, each memory cell across a row of the memory array together form a physical page.

"Conducting memory cells" refers to memory cells that conduct an electric current during a sense operation or a reading operation applied to the memory cells. In certain embodiments, such as flash memory, a sense operation or read operation may apply a certain voltage level, referred to as a reference voltage, to a selected word line of memory cells. Memory cells along the selected word line that conduct electric current may be detected by one or more sense circuits (aka sense amps) connected to bit lines that are connected to the memory cells of the selected word line.

In certain embodiments, once a set of conducting memory cells are identified, a set of nonconducting memory cells is readily determinable as every memory cell on the selected word line that did not conduct when the reference voltage was applied to the selected word line. For example, in one embodiment, given a set of all the memory cells of a selected word line, the set of nonconducting memory cells may comprise a set complement function applied to the set of conducting memory cells.

Those of skill in the art will recognize that the sense circuit, sense amp, may detect either which memory cells conduct electric current or which memory cells do not conduct electric current depending on how the sense circuit is configured. Furthermore, those of skill in the art will appreciate how to modify a sense circuit that determines conducting memory cells into a sense circuit that determines nonconducting memory cells.

In certain embodiments, a sense circuit determines a set of conducting memory cells based on a reference voltage applied to a selected word line. In one embodiment, the reference voltage is a read voltage applied over one or more steps to determine a data value stored by the memory cells. In another embodiment, the reference voltage is a sense voltage applied once to determine which memory cells conduct at the sense voltage rather than a data value stored by the memory cells.

"Sense voltage" refers to a voltage level configured to activate (cause to conduct) memory cells having a threshold voltage equal to or less than the sense voltage. In certain embodiments, a sense voltage may be used to read or sense a memory state for memory cells having a threshold voltage at or below the sense voltage. In other embodiments, a sense voltage is not used to read a memory state for memory cells having a threshold voltage at or below the sense voltage, but is used to determine which memory cells along a word line have a threshold voltage at or below the sense voltage.

"Nonconducting memory cells" refers to Memory cells that do not conduct an electric current during a sense operation or a reading operation applied to the memory cells. In certain embodiments, such as flash memory, a sense operation or read operation may apply a certain voltage level, referred to as a reference voltage, to a selected word line of memory cells. Memory cells along the selected word line that do not conduct electric current may be detected by one or more sense circuits (aka sense amps) connected to bit lines that are connected to the memory cells of the selected word line. In certain embodiments, when determining conducting memory cells, or when determining nonconducting memory cells, the selected word line may comprise any word line of a memory array.

In certain embodiments, once a set of nonconducting memory cells are identified, a set of conducting memory cells is readily determinable to comprise every memory cell on the selected word line that did conduct when the reference voltage was applied to the selected word line. For example, in one embodiment, given a set of all the memory cells of a selected word line, the set of conducting memory cells may comprise a set complement function applied to the set of nonconducting memory cells.

Those of skill in the art will recognize that the sense circuit, sense amp, may detect either which memory cells conduct electric current or which memory cells do not conduct electric current depending on how the sense circuit is configured. Furthermore, those of skill in the art will appreciate how to modify a sense circuit that determines nonconducting memory cells into a sense circuit that determines conducting memory cells.

In certain embodiments, a sense circuit determines a set of nonconducting memory cells based on a reference voltage applied to a selected word line. In one embodiment, the reference voltage is a read voltage applied over one or more steps to determine a data value stored by the memory cells. In another embodiment, the reference voltage is a sense voltage applied once to determine which memory cells do not conduct at the sense voltage rather than a data value stored by the memory cells.

A physical page may include memory cells along a row of the memory array for a single plane or for a single memory die. In one embodiment, the memory die includes a memory array made up of two equal sized planes. "Plane" refers to a division of a memory array that permits certain storage operations to be performed on both places using certain physical row addresses and certain physical column addresses. In one embodiment, a physical page of one plane of a memory die includes four data blocks (e.g., 16 KB). In one embodiment, a physical page (also called a "die page") of a memory die includes two planes each having four data blocks (e.g., 32 KB).

Commands and data are transferred between the host 108 and storage controller 208 via a data bus 228, and between the storage controller 208 and the one or more memory die 210 via bus 226.

The non-volatile memory array 212 can be two-dimensional (2D—laid out in a single fabrication plane) or three-dimensional (3D—laid out in multiple fabrication planes). The non-volatile memory array 212 may comprise one or more arrays of memory cells including a 3D array. In one embodiment, the non-volatile memory array 212 may comprise a monolithic three-dimensional memory structure (3D array) in which multiple memory levels are formed above (and not in) a single substrate, such as a wafer, with no intervening substrates. The non-volatile memory array 212 may comprise any type of non-volatile memory that is monolithically formed in one or more physical levels of arrays of memory cells having an active area disposed above a silicon substrate. The non-volatile memory array 212 may be in a non-volatile solid-state drive having circuitry associated with the operation of the memory cells, whether the associated circuitry is above or within the substrate. Word lines may comprise sections of the layers containing memory cells, disposed in layers above the substrate. Multiple word lines may be formed on single layer by means of trenches or other non-conductive isolating features.

"Circuitry" refers to electrical circuitry having at least one discrete electrical circuit, electrical circuitry having at least one integrated circuit, electrical circuitry having at least one application specific integrated circuit, circuitry forming a general purpose computing device configured by a computer program (e.g., a general purpose computer configured by a computer program which at least partially carries out processes or devices described herein, or a microprocessor configured by a computer program which at least partially carries out processes or devices described herein), circuitry forming a memory device (e.g., forms of random access memory), circuitry forming a communications device (e.g., a modem, communications switch, or optical-electrical equipment), and the like.

The die controller 206 cooperates with the read/write circuits 214 to perform memory operations (e.g., storage operations) on memory cells of the non-volatile memory array 212, and includes a state machine 220, an address decoder 222, and a power control 224. The state machine 220 provides chip-level control of memory operations.

"Die controller" refers to a set of circuits, circuitry, logic, or components configured to manage the operation of a die. In one embodiment, the die controller is an integrated circuit. In another embodiment, the die controller is a combination of discrete components. In another embodiment, the die controller is a combination of one or more integrated circuits and one or more discrete components.

The address decoder 222 provides an address interface between an address used by the host or a storage controller 208 to the hardware address used by the row decoder 216 and column decoder 218. The power control 224 controls the power and voltages supplied to the various control lines during memory operations. The power control 224 and/or read/write circuits 214 can include drivers for word lines, source gate select (SGS) transistors, drain gate select (DGS) transistors, bit lines, substrates (in 2D memory structures), charge pumps, and source lines. In certain embodiments, the power control 224 may detect a sudden loss of power and take precautionary actions. The power control 224 may include various first voltage generators (e.g., the drivers) to generate the voltages described herein. The sense blocks can include bit line drivers and sense amplifiers in one approach.

In some implementations, some of the components can be combined. In various designs, one or more of the components (alone or in combination), other than non-volatile memory array 212, can be thought of as at least one control circuit or storage controller which is configured to perform the techniques described herein. For example, a control circuit may include any one of, or a combination of, die controller 206, state machine 220, address decoder 222, column decoder 218, power control 224, sense blocks SB1, SB2, . . . , SBp, read/write circuits 214, storage controller 208, and so forth.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the storage controller 208 to perform the methods described herein. The host may also include additional system memory, one or more input/output interfaces and/or one or more input/output devices in communication with the one or more processors, as well as other components well known in the art.

Associated circuitry is typically required for operation of the memory cells and for communication with the memory cells. As non-limiting examples, memory devices may have circuitry used for controlling and driving memory cells to accomplish functions such as programming and reading. This associated circuitry may be on the same substrate as the memory cells and/or on a separate substrate. For example, a storage controller for memory read-write operations may be located on a separate storage controller chip and/or on the same substrate as the memory cells.

One of skill in the art will recognize that the disclosed techniques and devices are not limited to the two-dimensional and three-dimensional exemplary structures described but covers all relevant memory structures within the spirit and scope of the technology as described herein and as understood by one of skill in the art.

Figure 3:
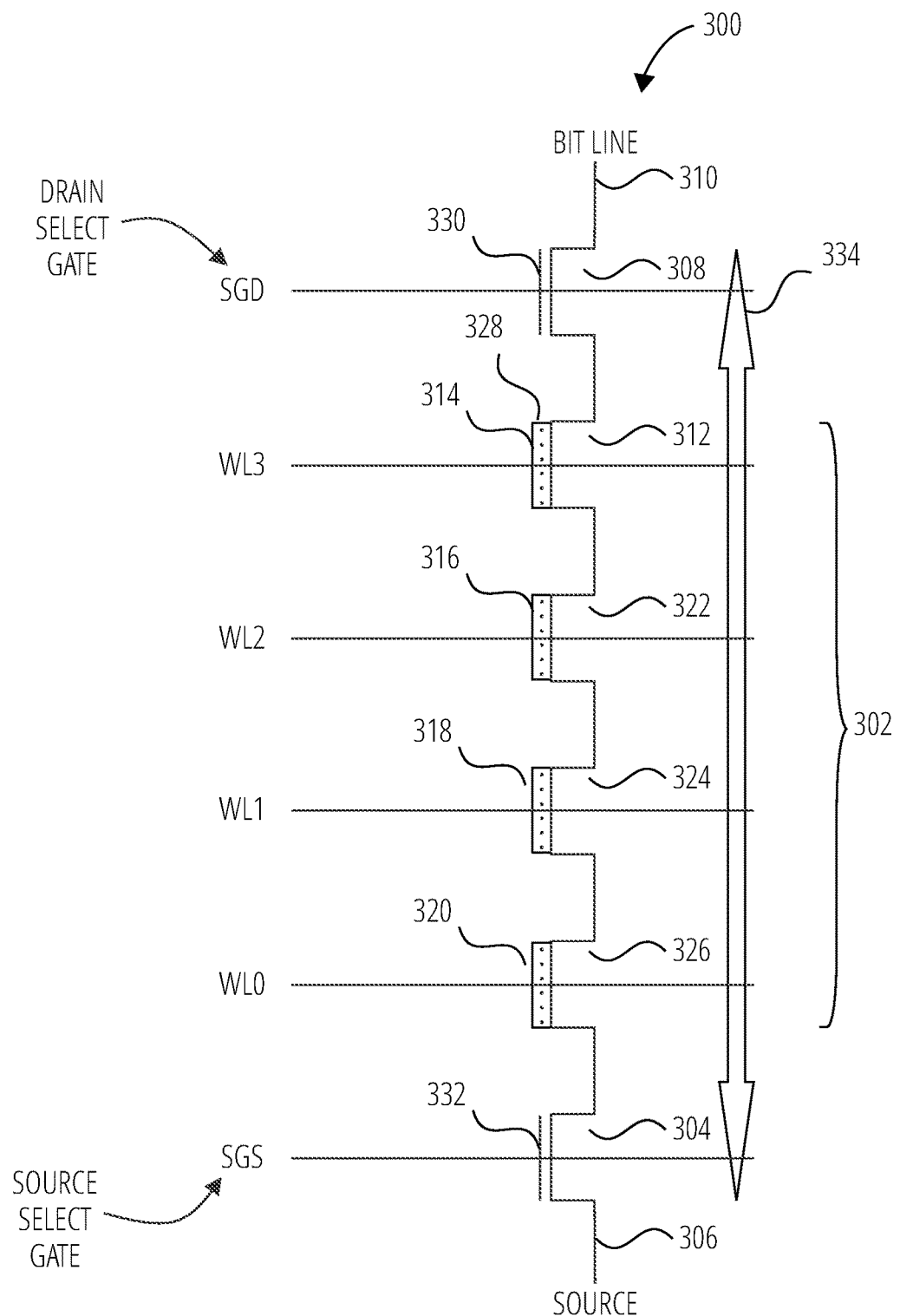
FIG. 3 is a schematic block diagram illustrating one embodiment of a NAND string 300.

FIG. 3 depicts one embodiment of a NAND string 300 comprising a plurality of memory cells. A NAND string 300 comprises a series or set of memory cells 302 (e.g., n=4, 8, 16 or higher) daisy-chained by their sources and drains. "NAND string" or "memory string" refers to circuitry that includes a plurality of memory cells. A NAND string includes a series of memory cells configured as transistor (e.g., n=4, 8, 16 or higher) daisy-chained by each memory cell's source terminals and drain terminals. At least one pair of select transistors (e.g. Select gates) connect the memory transistor chain, the NAND string, to a bias source by way of the NAND string's drain terminal and to a ground source by way of the NAND string's source terminal.

The daisy-chained set of memory cells of a NAND string configure one source terminal of a memory cell in the chain at one end of the NAND string (referred to herein as a source terminal of the NAND string) and one drain terminal of a memory cell in the chain at an opposite end of the NAND string (referred to herein as a drain terminal of the NAND string). Circuits, circuit components, select gates, control line, and positioned on, or around, the source terminal of the NAND string are referred to as being positioned source side. Circuits, circuit components, select gates, control line, and positioned on or around the drain terminal of the NAND string are referred to as being positioned drain side.

In a memory array configuration, when a select transistor coupled to a source terminal of a first memory cell in the NAND string is turned on, the source terminal is coupled to a source line. Similarly, when a select transistor coupled to a drain terminal of a memory cell in the NAND string is turned on, the drain terminal is coupled to a bit line of the memory array. A NAND string may also be referred to as a memory string.

A pair of select transistors (e.g., select gates) connect the memory transistor chains to a bias by way of the NAND string's drain terminal and to a ground source by way of a source terminal. In a memory array, when the select transistor 304 is turned on, the source terminal is coupled to a source line 306. Similarly, when the select transistor 308 is turned on, the drain terminal of the NAND string is coupled to a bit line 310 of the memory array.

Each memory cell in the chain may comprise a transistor. The memory cell has a charge storage element to store a given amount of charge so as to represent an intended memory state. "Memory state" refers to a condition of a memory cell designed and/or configured to represent an encoding for one or more data bit values. In certain embodiments, the memory state may be changed by using a storage operation. In a non-volatile memory cell, the memory cell maintains its memory state without a power source.

A control gate of each memory transistor allows control over read and write operations. The control gates of corresponding memory transistors of a row of memory array (one from each NAND string) are all connected to the same word line. Similarly, a control gate of each of the select transistors provides controlled access to the NAND string via its source terminal and drain terminal respectively.

When an addressed memory cell (e.g., transistor 312) within a NAND string is read or is verified during programming, its control gate (e.g., control gate 314) is supplied with an appropriate voltage, also referred to as a reference voltage or read voltage. At the same time, the rest of the non-addressed memory cells in the NAND string 300 are fully turned on by application of sufficient voltage (also referred to as a pass voltage) on their control gates (e.g., control gate 316, control gate 318, and control gate 320 in FIG. 3). In this way, a conductive path is effectively created from the source of the individual memory cell to the source terminal (e.g., source line 306) of the NAND string 300 and likewise for the drain of the individual memory cell to the drain terminal (e.g., bit line 310) of the memory cell. This conductive path may travel through one or more structures of a NAND string and is referred to herein as channel.

"Read voltage" refers to a voltage level configured to test, or check, which memory cells conduct at the voltage level. In certain embodiments, depending on the type of encoding used to store data on the memory cell and the number of bits encoded on each memory cell, a single read/sense operation using a single read voltage may be determinative of the memory state of the memory cell. In other embodiments, a number of read/sense operations each performed at different read voltage may be used to determine the memory state of the memory cell. The determined memory state may then be decoded into a representation of the data bits stored by the memory cell.

Said another way, one or more read voltages are used to determine a memory state for a memory cell and the memory state is representative of one or more data values for data bits stored/encoded in the memory cell.

In certain embodiments, a read voltage may be referred to as a reference voltage. Accordingly, in certain examples and/or embodiments, different read voltages may be represented by an abbreviation and a number. For example, two read voltages may be referred to as Control Gate Voltage 1 (VCG1) or VCG2, etc.

In other embodiments, where each memory state may be associated with an abbreviation such as ER for the erased memory state, A for a next highest range of voltages memory state, B for a next highest range of voltages memory state, C for a next highest range of voltages memory state, D for a next highest range of voltages memory state, E for a next highest range of voltages memory state, F for a next highest range of voltages memory state, and G for a next highest range of voltages memory state. In such embodiments, the read voltage may comprise a voltage level that marks the lower voltage defining the memory state and may be referred to using an abbreviation that includes the letter abbreviation. For example, VrA, VrB, VrC, VrD, VrE, VrF, and VrG may be used.

"Pass voltage" refers to a voltage level configured to activate (cause to conduct) memory cells regardless of the memory state stored/retained on the memory cell. A pass voltage is set to a high enough voltage that memory cells having a high threshold voltage (e.g., greater than 6 volts) will activate/conduct when the pass voltage is supplied to a gate of the memory cell implemented as a transistor.

In certain embodiments, the purpose of a pass voltage, is to create a conduction path between a sense amplifier connected to a bit line at one end of a NAND string (also referred to a as a channel) that includes the memory cell and a source line connected at the other end of the NAND string. The conduction path may be desired so that a memory cell along the NAND string coupled to a selected word line can be read, sensed, or programmed. In one embodiment, a pass voltage is provided to unselected word lines so that a storage operation can be performed on memory cells of a selected word line. In certain embodiments, a pass voltage is not used to read a memory state of a memory cell.

The example NAND string 300 depicted in FIG. 3, in some embodiments, includes four transistors (transistor 312, transistor 322, transistor 324, and transistor 326) connected in series and located between a first select transistor 308 and a second select transistor 304. In some embodiments, the transistor 312, transistor 322, transistor 324, and transistor 326 each include a control gate with a charge trap layer 328. Control gate 314, control gate 316, control gate 318, and control gate 320, in one embodiment, are connected to, or comprise a portion of, a word line. In a further embodiment, transistor 312, transistor 322, transistor 324, and transistor 326 are memory cells, storage elements, or the like, also referred to herein as memory cells. In some embodiments, a single memory cell may include multiple transistors.

The first select transistor 308, in some embodiments, gates/connects the NAND string 300 to a bit line 310 via a drain select gate/select gate drain (SGD). The second select transistor 304, in certain embodiments, gates/connects the NAND string 300 to a source line 306 via a source select gate/select gate source (SGS). The first select transistor 308, in a further embodiment, is controlled by applying a voltage to a corresponding select gate 330. The second select transistor 304, in some embodiments, is controlled by applying a voltage to corresponding select gate 332.

As shown in FIG. 3, the source line 306, in one embodiment, is connected to the source lead of each transistor/memory cell in the NAND string 300. The NAND string 300, in some embodiments, may include some memory cells that have been programmed and some memory cells that have not been programmed.

On the physical memory die, a channel 334 extends from the source side to the drain side of the NAND string. "Channel" refers to a structure within a memory array that extends from a source side to a drain side. In one embodiment, a channel is a vertical column within a memory array that forms a conductive path between a source line coupled to one end of a NAND string and a bit line coupled to another end of the NAND string. A channel may be formed from a variety of materials including, for example, polysilicon.

In one embodiment, a channel within a NAND string creates a conductive path by activating one or more memory cells (e.g., one or more selected memory cells and unselected memory cells) along the NAND string, and one or more control structures (e.g., select gates (source and/or drain) between a source line connected to one end (e.g., the source side) of the NAND string and a sense amplifier or bit line connected to the other end (e.g., the drain side) of the NAND string.

Figure 4:
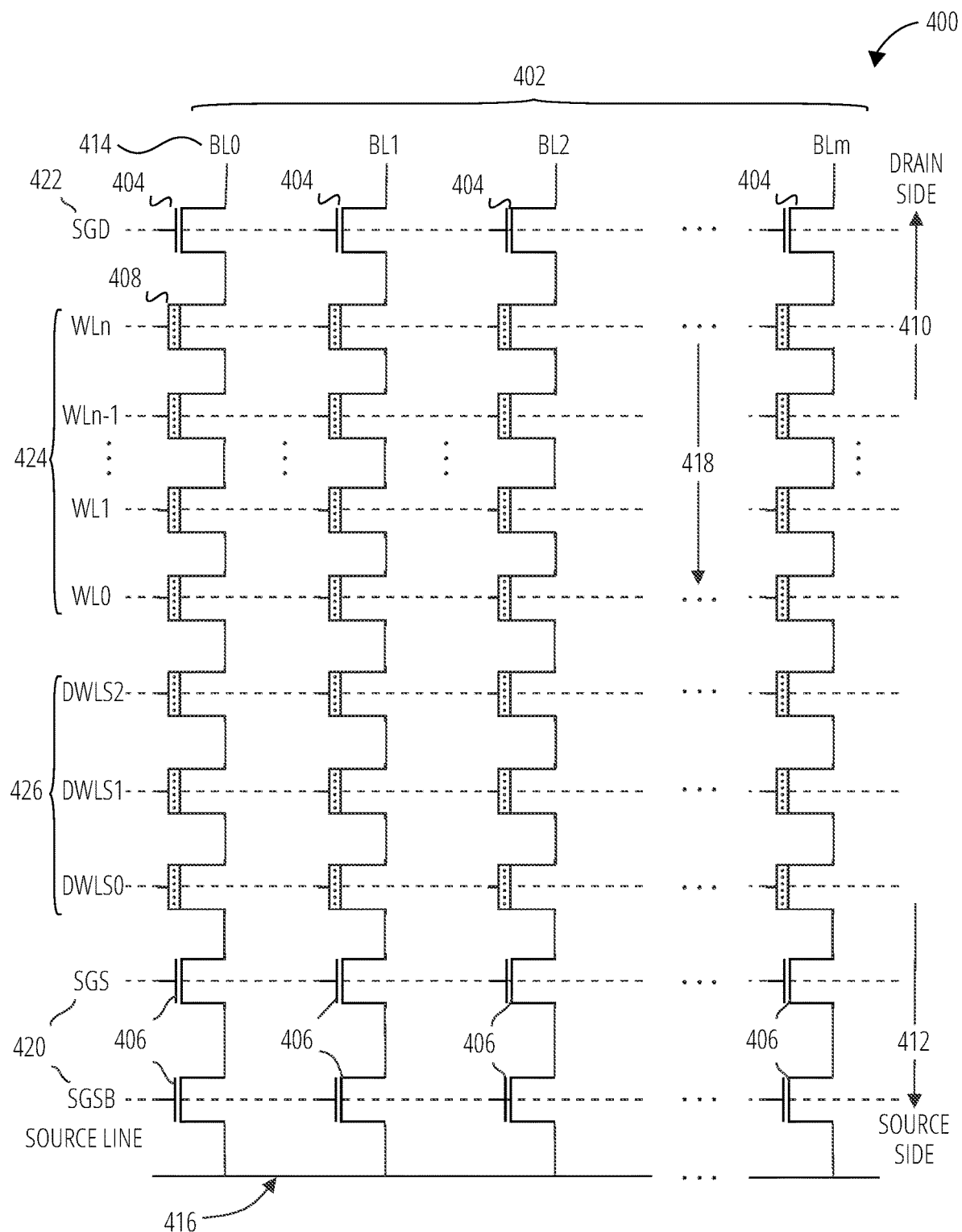
FIG. 4 is a schematic block diagram illustrating one embodiment of a three-dimensional memory array 400.

FIG. 4 is a circuit diagram depicting a three-dimensional memory array 400 comprising a plurality of NAND strings 402. An architecture for a memory array using a NAND structure may include a significant number of NAND strings. In the depicted embodiment, each NAND string 402 includes drain-side select gates 404, source-side select gates 406, and memory cells 408. The memory cells 408 may be transistors that incorporate a charge trap layer. While five memory cells per NAND string are illustrated for simplicity, some NAND strings may include any number of memory cells (e.g., thirty-two, sixty-four, or more). The memory cells 408 may be chained from the drain side 410 to the source side 412. On the drain side 410 each NAND string 402 may connect to a bit line 414. On the source side 412, the NAND strings 402 may connect to a source line 416.

"Drain-side select gate" refers to a select gate functioning as a switch to electrically connect a bit line to a NAND string and/or a channel of a NAND string. A select gate positioned between the bit line and the NAND string on the drain side of the NAND string is referred to as a drain-side select gate.

"Source-side select gate" refers to a select gate functioning as a switch to electrically connect a source line to a NAND string and/or a channel of a NAND string. Examples of source lines include source-side select gates, dummy word line select gates, and the like. In certain embodiments, a source-side select gate may comprise just source-side select gates (e.g., SGS0, SGS1, etc.). In other embodiments, a source-side select gate may comprise just dummy word line select gates (e.g., DWLS0, DWLS1, etc.). In still other embodiments, a source-side select gate may comprise both source-side select gates (e.g., SGS0, SGS1, etc.) and dummy word line select gates (e.g., DWLS0, DWLS1, etc.). A select gate positioned between the source line and the NAND string on the source side of the NAND string is referred to as a source-side select gate.

"Source line" refers to a structure, circuit, circuitry, and/or associated logic configured to convey an electrical current and/or voltage from a supply to one or more channels of associated NAND strings. In certain embodiments, a source line is configured to convey a voltage to, and/or discharge a voltage from multiple NAND strings concurrently. In other embodiments, a source line is configured to convey a voltage to, and/or discharge a voltage from multiple NAND strings in series.

In certain embodiments, a source control line couples to one or more source-side select gates that are between the source line and one or more NAND strings and the source control line manages whether voltage or current passes between the source line and the NAND string. In such an embodiment, the source line may also be referred to as a common source line.

The NAND strings 402 in one embodiment, are connected to the source line 416 by source-side select gates 406. Source control lines 420 (SGS and SGSB) may be used to control the source-side select gates 406 (transistors). The various NAND strings 402, in one embodiment, are connected to bit lines 414 by drain-side select gates 404 as shown. The drain-side select gates 404 may be controlled by a drain control line 422 (SGD). In some embodiments, the source control lines and drain control lines (referred to collectively as control lines) may not necessarily be configured in common among the NAND strings; that is, different control lines may be provided for different NAND strings.

"Control line" refers to a structure, circuit, circuitry, and/or associated logic configured to convey an electrical current and/or voltage from a source to a destination. In certain embodiments, analog voltages, currents, biases, and/or digital signals supplied or discharged over a control line are used to control switches, select gates, and/or other electrical components. Certain control lines may have a specific name based on what parts of a circuit the control line controls or where the control line couples, or connects, to other circuits. Examples of named control lines include word lines, bit lines, source control lines, drain control lines, and the like. "Source control line" refers to a control line configured to operate a select gate (e.g., turn the select gate on, activate, and off, deactivate) for coupling a source side of a NAND string to a source line and/or another circuit. "Drain control line" refers to a control line configured to operate a select gate (e.g., turn the select gate on, activate, and off, deactivate) for coupling a drain side of a NAND string to a bit line and/or a sense circuit.

As described above, each word line WL0-WLn, where WLn is the word line closest to the drain-side select gates 404, comprises one or more memory cells 408. In the depicted embodiment, each bit line 414 and respective NAND string 402 comprise the columns of the three-dimensional memory array 400, storage block, erase block, or the like. These columns may also be referred to as channels. The word lines 424 WL0-WLn, in some embodiments, comprise the rows of the three-dimensional memory array 400, storage block, erase block, or the like. Each word line WL0-WLn, in some embodiments, connects the control gates of each memory cell 408 in a row. Alternatively, the control gates may be provided by the word lines 424 WL0-WLn themselves. In some embodiments, a word line may include tens, hundreds, thousands, millions, or the like of memory cells 408.

"Sequential order" refers to a set of steps, operations, sub-steps, or events that are arranged to be done in a certain sequence. "Sequence" refers to an order in which a certain activity, event, or operation is performed or carried out.

In a memory array, word lines may be organized or architected to facilitate use in a sequential order so that the memory array is used efficiently. The same, or different sequences, may be used for any of the storage operations.

For example, in one embodiment, the word lines of a memory array may be programmed in sequential order starting from a word line closest to a source line and progressing sequentially with each adjacent unprogrammed word line toward a word line closest to a select gate drain and/or bit line. In another example, in one embodiment, the word lines of a memory array may be programmed in sequential order starting from a word line closest to a select gate drain and/or bit line and progressing sequentially with each adjacent unprogrammed word line toward a word line closest to a source line and/or source select gate. In still other examples, a sequence for choosing which word line to program after a last programmed word line may follow a pattern other than sequential.

The word lines 424 may, in this disclosure, be accessed (e.g., programmed or read) in a word line sequential order (programming sequence) 418. One sequence of word lines, according to one embodiment, is indicated by the arrow word line sequential order (programming sequence) 418. When word lines are programmed in word line sequential order (programming sequence) 418, the word lines are programmed in sequence, one after the other, starting from one end of the NAND strings. When a storage operation is directed at a single word line, that word line is referred to herein as a selected word line. In the disclosed solution, word lines may be programmed using reverse order programming (ROP). In ROP, the word line sequential order (programming sequence) 418 is from highest numbered word line (WLn) on the drain side 410 to the lowest number (WL0) on the source side 412.

"Selected word line" refers to a word line designated for use in a particular storage operation or memory operation. Certain storage operations such as programming, reading, or sensing, may be performed on memory cells of a selected word line through a series of one or more steps. Other storage operations such as erasing memory cells, in one embodiment, may be performed on memory cells of a plurality of word lines simultaneously through a series of one or more steps. In such embodiments, the erase operation may be performed on multiple selected word lines.

Other word lines that are not a focus of a storage operation are referred to as unselected word lines. "Unselected word line" refers to a set of word lines that are not designated for use in a particular storage operation or memory operation. This means that performing the storage operation is not intended to change the memory state of memory cells of the unselected word lines. Changes to memory state of memory cells of the unselected word lines is inadvertent and may be considered a disturb or unintended consequence.

While memory cells of unselected word lines are not intended to change memory state because of the storage operation, performance of the storage operation may still require applying certain biases, or voltages to the word lines of unselected word lines and/or may include certain biases or voltages applied to bit lines that connect to the NAND strings of channels that include the unselected word lines. In certain embodiments, biases applied to unselected word lines are applied to all unselected word lines simultaneously, still other unselected word lines may receive a different bias than that applied to a first set of unselected word lines in order to satisfactorily conduct the storage operation.

"Bit line voltage" refers to a voltage level supplied to, or built up within, a bit line. In certain embodiments, a bit line connects to a sense amplifier by way of a switch (e.g., a transistor) that controls whether bias/charge on the bit line is provided to a channel or NAND string of a memory array. In certain embodiments, a bit line voltage may be referred to by the abbreviation VBLC.

"Program disturb" refers to a type of electronic interference and/or magnetic interference created during, or after, or as a results of, a programming storage operation and/or a stage of a programming storage operation.

A word line selected for a program operation (the selected word line) and the unselected word lines (all other word lines) may be organized in this word line sequential order (programming sequence) 418, from WLn to WL0, and the die controller may be configured to program each word line of the three-dimensional memory array in this sequential order such that the adjacent word line is programmed after the selected word line. For example, if WL43 is the selected word line, the adjacent word line WL42 may be programmed after WL43.

"Adjacent word line" refers to a word line physically positioned within a memory array structure such that the word line is adjacent to a selected word line.

During programming of an adjacent word line, a coupling effect, or disturb, may cause a shift in the charge stored in memory cells of the selected word line, depending on the state programmed to the memory cells in the adjacent word line. This coupling effect may cause memory cells of the selected word line to be read, or sensed, incorrectly. Consequently, a compensation may be applied when reading memory cells of the selected word line to account for a coupling effect.

"Coupling effect" refers to a change in bias, electric potential, voltage, and/or electromagnetic field between two circuits, portions of circuits, circuitry, or other electronic components, including semiconductors. In a memory array, a coupling effect may cause undesirable effects to various structures and/or circuit components of the memory array, including memory cells, NAND string channels, select gates, and the like. Thus, a coupling effect may be referred to herein as a type of disturb, at least in part, because of these undesired effects. A coupling effect, depending on when and/or how the effect occurs, may also be referred to as a programming disturb, a program disturb, or a read disturb.

A coupling effect may select gates used to manage a bias level within channels of NAND strings. For example, a bias on one or more control lines coupled to the select gates may introduce a sufficiently strong potential on a voltage level within in a channel that the voltage of the channel couples up (or down, depending on the sign of the bias) because of the influence of the electromagnetic field created by the signal in the control lines.

In this manner, the apparatus claimed herein may comprise a die controller that is configured to program word lines of the three-dimensional memory array by programming each word line in a sequence progressing from the plurality of drain side dummy word lines (not shown) toward the source side dummy word lines 426. "Dummy word line" refers to a structure within a memory array configured like a word line that stores data in memory cell, however a dummy word line is not regularly used to store data and instead is positioned, controlled, and managed within the memory array to compensate for, mitigate, or buffer against electrical interference, or disturbs from electrical circuitry positioned around the dummy word line. In one embodiment, a dummy word line includes a set of memory cells positioned at an intersection of a dummy word line and a NAND string, each memory cell coupled to the dummy word line by a dummy word line select gate. A control signal sent on the dummy word line may have a voltage at, or above, a threshold voltage for the dummy word line select gates such that the dummy word line select gate as activated which may enable a bias or current to pass within the channel of the NAND string and between a source terminal and a drain terminal of the memory cell. In this manner, the dummy word line may serve as a control line.

In an embodiment, the die controller may be configured to program word lines of the three-dimensional memory array starting from a word line closest to the drain-side select gate (i.e., WLn) and progressing in a sequence from the drain-side select gate toward the source-side select gate. The die controller may also be configured to precharge the NAND strings using a source-side precharge stage. The precharge stage may provide improved performance during ROP of a memory array such as the one illustrated.

In one embodiment, each memory cell is configured to store data. For example, when storing one bit of digital data, the range of possible threshold voltages ("Vt") of each memory cell may be divided into two ranges which are assigned logical data "1" and "0." As used herein, threshold voltage refers to a magnitude of voltage applied to the gate of a memory cell sufficient to cause the memory cell to activate. In embodiments, in which the memory cell is a NAND transistor, the threshold voltage is a sufficient voltage applied to a gate terminal of the transistor that causes the transistor to conduct current between its source terminal and drain terminal. In one example of a NAND type flash memory, the Vt may be negative after the memory cells are erased and defined as logic "1." In one embodiment, the Vt after a program operation is positive and defined as logic "0."

When the Vt is negative and a read is attempted, in some embodiments, memory cells will turn on to indicate logic "1" is being stored. When the Vt is positive and a read operation is attempted, in a further embodiment, a memory cell will not turn on, which indicates that logic "0" is stored. Each memory cell may also store multiple levels of information, for example, multiple bits of digital data. In such an embodiment, the range of Vt value is divided into the number of levels of data. For example, if four levels of information can be stored in each memory cell, there will be four Vt ranges assigned to the data values "11", "10", "01", and "00."

In one example of a NAND type memory, the Vt after an erase operation may be negative and defined as "11." Positive Vt values may be used for the states of "10", "01", and "00." In one embodiment, the specific relationship between the data programmed into the memory cells and the threshold voltage ranges of the memory cells depends upon the data encoding scheme adopted for the memory cells.

Figure 5:
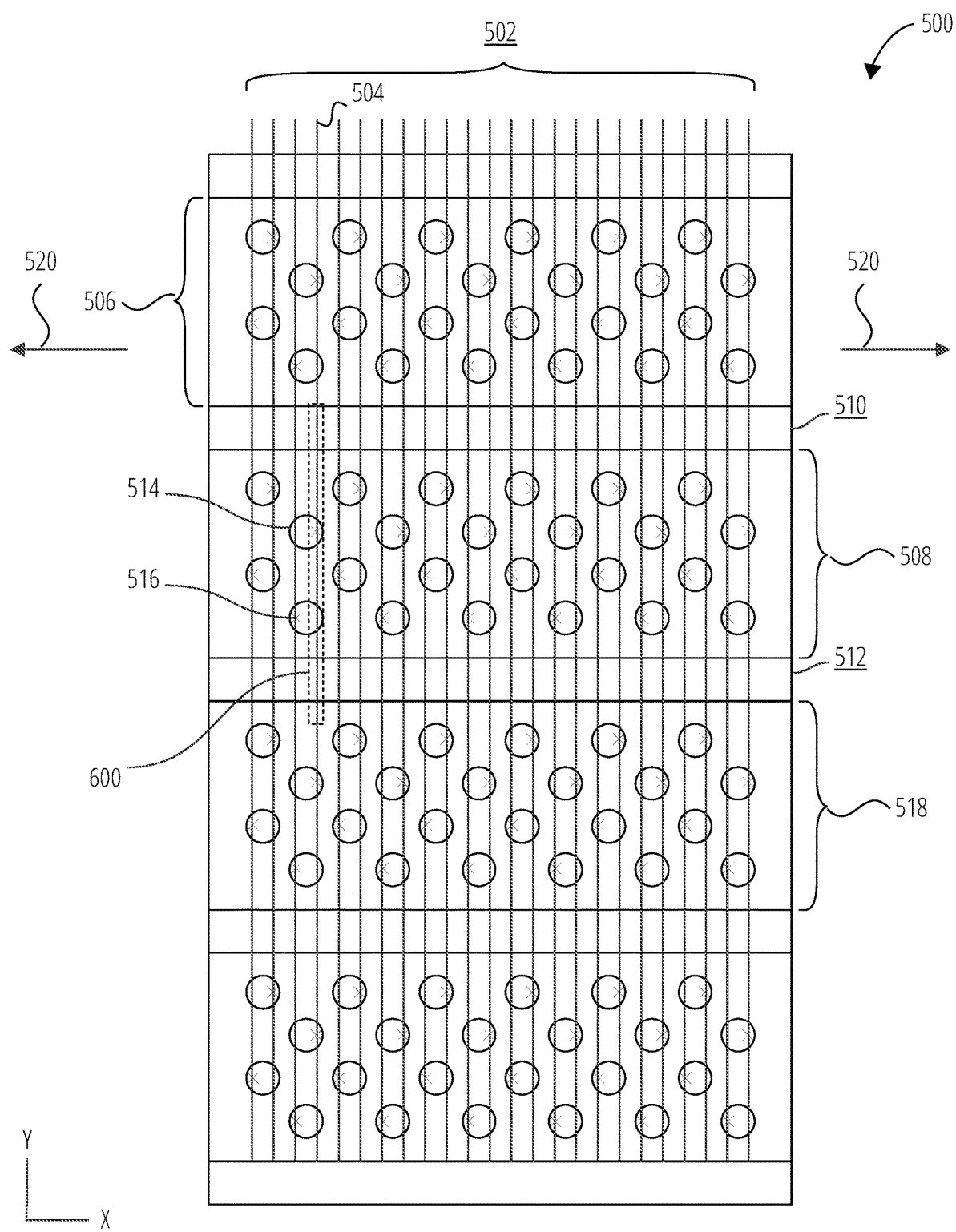
FIG. 5 illustrates one embodiment of a top view of a portion of a memory array 500.
Figure 6:
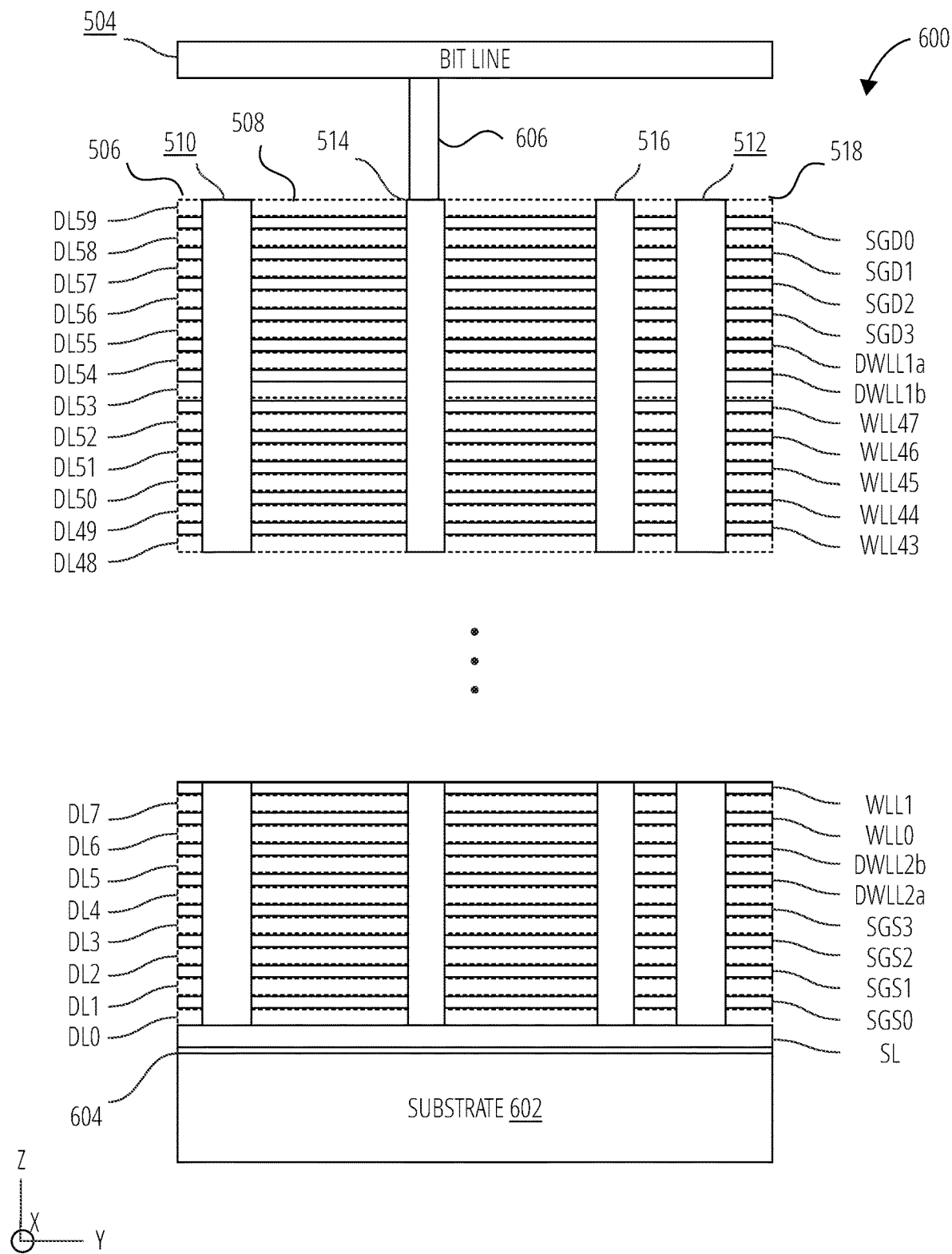
FIG. 6 illustrates one embodiment of a cross-sectional view of a portion of a memory array 600.

FIG. 5 and FIG. 6 depict different views of an example three dimensional memory array. FIG. 5 is a block diagram depicting a top view of a portion of three dimensional memory array. As can be seen from FIG. 5, the memory array extends 520 in the direction of the arrows shown. In one embodiment, the memory array may have between 60-128 layers. Other embodiments may have less than or more than 60-128 layers. However, FIG. 5 shows the top layer.

FIG. 5 depicts a top view of a portion of a memory array 500. A plurality of circles represent the vertical columns (e.g., vertical column 514 and vertical column 516 also referred to as channels). Each of the vertical columns includes multiple select transistors and multiple storage cells. In one embodiment, each of the vertical columns implements a NAND string. More details of the vertical columns are provided below. Since the memory array extends 520 in the direction of the two arrows shown, an erase block includes more vertical columns 522 than depicted in FIG.

"Erase block" refers to a logical erase block or a physical erase block. In one embodiment, a physical erase block represents the smallest storage unit within a given memory die that can be erased at a given time (e.g., due to the wiring of storage cells on the memory die). In one embodiment, logical erase blocks represent the smallest storage unit, or storage block, erasable by a storage controller in response to receiving an erase command. In such an embodiment, when the storage controller receives an erase command specifying a particular logical erase block, the storage controller may erase each physical erase block within the logical erase block simultaneously. It is noted that physical erase blocks within a given logical erase block may be considered as contiguous within a physical address space even though they reside in separate dies. Thus, the term contiguous may be applicable not only to data stored within the same physical medium, but also to data stored within separate media. 5.

FIG. 5 also depicts a set of bit lines 502. FIG. 5 shows twenty-four bit lines because only a portion of an erase block is depicted. It is contemplated that more than twenty-four bit lines are connected to vertical columns of the erase block. Each of the circles representing vertical columns has an "x" to indicate its connection to one bit line 504.

Although FIG. 5 shows regions having four rows of vertical columns, four portions and sixteen rows of vertical columns, those exact numbers are an example implementation. Other embodiments may include more or less regions, more or less rows of vertical columns per region and more or less rows of vertical columns per block. FIG. 5 also shows the vertical columns being staggered. In other embodiments, different patterns of staggering can be used. In some embodiments, the vertical columns are not staggered.

FIG. 6 depicts a cross-sectional view of a portion of a memory array 600. As indicated in FIG. 5, this cross-sectional view cuts through vertical column 514 and vertical column 516 and erase block portion 508 (see FIG. 5). The structure of FIG. 6 includes four drain side select layers SGD0, SGD1, SGD2, and SGD3; four source side select layers SGS0, SGS1, SGS2, and SGS3; four dummy word line layers DWLL1 a, DWLL1 b, DWLL2 a, and DWLL2 b; and forty-eight data word line layers WLL0-WLL47 for connecting to data memory cells. Other embodiments may implement more or less than four drain side select layers, more or less than four source side select layers, more or less than four dummy word line layers, and more or less than forty-eight word line layers. The ability to include multiple dummy word lines and multiple source select gates and drain select gates may facilitate implementing the apparatuses and method(s) disclosed herein.

Vertical column 514 and vertical column 516 are depicted protruding through the drain side select layers, source side select layers, dummy word line layers and word line layers. In one embodiment, each vertical column comprises a NAND string. In certain embodiments, below the vertical columns and the layers listed below is a substrate 602, an insulating film 604 on the substrate 602, and source line (SL). The NAND string of vertical column 514 has a source end (e.g., source side) at a bottom of the stack and a drain end (e.g., drain side) at a top of the stack. FIG. 6 shows vertical column 514 connected to bit line 504 via connector 606. Trench 510 and trench 512 are also depicted. Erase block portion 506 and erase block portion 518 extend to either side of the erase block portion 508 shown.

For ease of reference, drain side select layers SGD0, SGD1, SGD2, and SGD3; source side select layers SGS0, SGS1, SGS2, and SGS3; dummy word line layers DWLL1 a, DWLL1 b, DWLL2 a, and DWLL2 b; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten, or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from SiO2. In other embodiments, other dielectric materials may be used to form the dielectric layers.

The non-volatile memory cells are formed along vertical columns (also referred to as channels) which extend through alternating conductive and dielectric layers in the stack. In one embodiment, the memory cells are arranged in NAND strings. The word line layers WLL0-WLL47 connect to storage cells (also called storage cells, memory cells, or data memory cells). Dummy word line layers DWLL1 a, DWLL1 b, DWLL2 a, and DWLL2 b connect to dummy storage cells. A dummy storage cell does not store user data, while a data storage cell is eligible to store user data. Drain side select layers SGD0, SGD1, SGD2, and SGD3 comprise select gates and are used to electrically connect and disconnect NAND strings from bit lines. Source side select layers SGS0, SGS1, SGS2, and SGS3 comprise select gates and are used to electrically connect and disconnect NAND strings from the SL. The layers (e.g., WLL, DWLL, SGD, SGS, etc.) serve as control lines for use in implementing storage operations on the memory array.

Figure 7:
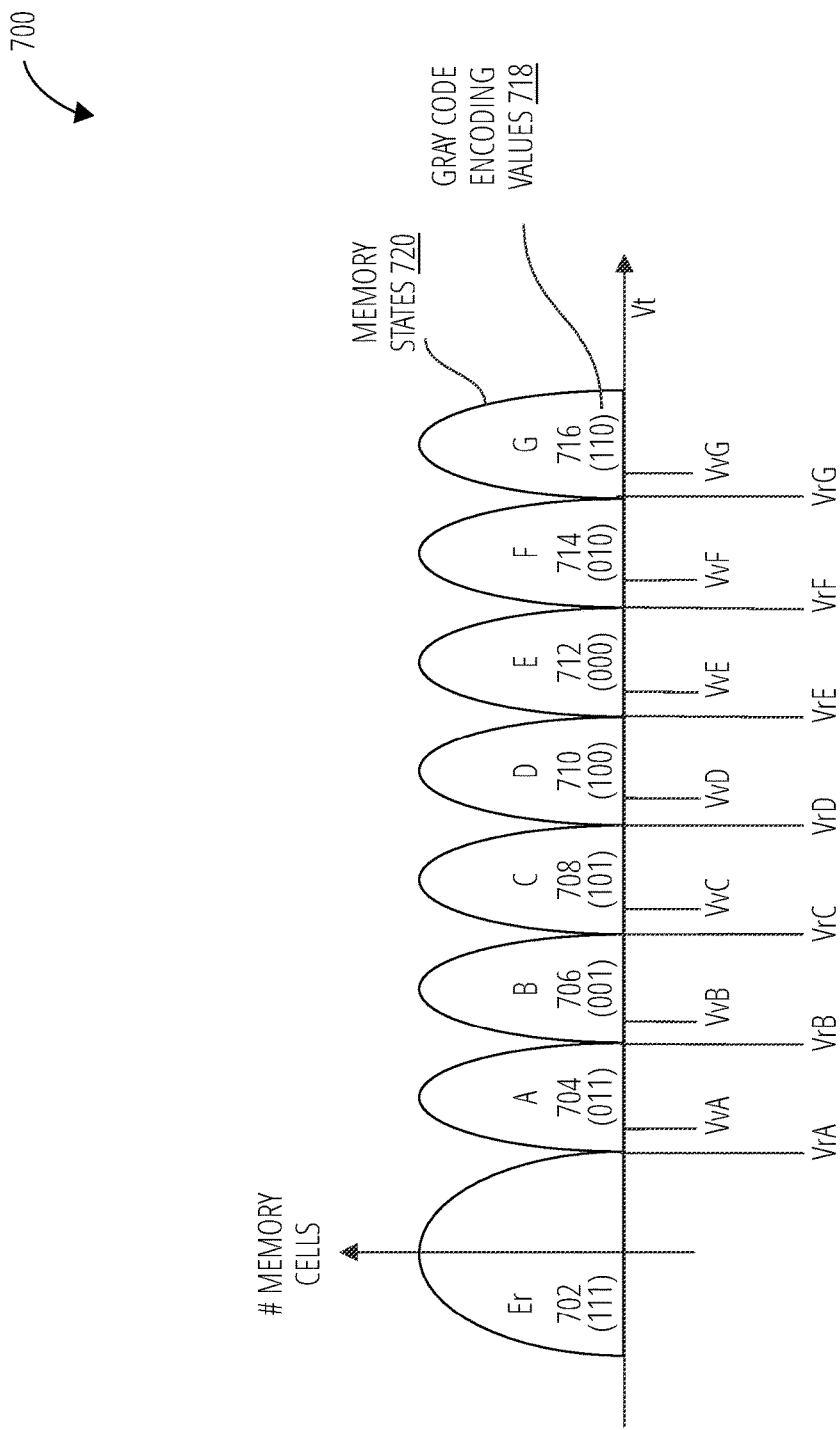
FIG. 7 illustrates threshold voltage distribution curves 700.

FIG. 7 illustrates threshold voltage distribution curves 700. The illustrated voltage distribution curves are for memory cells programmed to store three bits of data. At a given point in time, each memory cell may be in a plurality of memory state (also referred to as data states). The memory states may include an erased state and a plurality of programmed states. The number of programmed states corresponds to the number of bits the memory cells are programmed to store.

With reference to this FIG. 7, a memory cell programmed to store three bits may be in an erased state Er 702 or one of seven programmed states A 704, B 706, C 708, D 710, E 712, F 714, or G 716. Each voltage distribution curve is associated with the erased state or one of the programmed states. Additionally, each threshold voltage distribution curve defines, and/or is associated with, a distinct threshold voltage range that, in turn, defines, is assigned, or is associated with a distinct one of a plurality of predetermined n-bit binary values. As such, determining what threshold voltage Vt a memory cell has enables the data (i.e., the logic values of the bits) that the memory cell is storing to be determined.

The specific relationship between the data programmed into the memory cells and the threshold voltage levels of the memory cell depends on the data encoding scheme used for programming the memory cells. In one example, a Gray code scheme may be used to assign data values to the threshold voltage distribution curves. "Gray code encoding" refers to a type of encoding scheme based on a numbering system that assigns a certain bit values to a range of threshold voltages that a memory cell may have. The bit values are assigned such that the bit pattern differs between adjacent threshold voltage ranges by only one bit. Such a bit pattern assignment is advantageous because while a threshold voltage may change, drift, from one range to a neighboring range, unintended change or drift is likely not enough to cause a two bit change in the encoding. In this manner, undesired drift can be detected and accommodated.

In one example, the range of threshold voltages may be one of a plurality of threshold voltage ranges that may be used to encode multiple bits of data into a memory cell. For example, suppose a memory cell is configured to store two bits of information, and the successive ranges of threshold voltages are between a negative lower bound threshold voltage and positive upper bound threshold, e.g., about 5 volts. If four ranges are defined the lower most range may have a bit assignment of '00', the next highest a bit assignment of '01', the next highest a bit assignment of '10', and the last range a bit assignment of '10', Of course, memory cells that store multiple bits of data may use a gray code encoding or another encoding process, such as those described in US patents: U.S. Pat. No. 6,222,762 and/or U.S. Pat. No. 7,237,074 which are included herein by reference, for all purposes.

Under a gray code encoding scheme, for memory cells programmed with two bits of data, the data value "11" is assigned to the range of threshold voltages associated with the erased state Er 702, the data value "01" is assigned to the range of threshold voltages associated with programmed state A 704, the data value "00" is assigned to the range of threshold voltages associated with programmed state B 706, and the data value "10" is assigned to the range of threshold voltages associated with the pro-grammed state C 708. Similar relationships between data values and memory states can be made for memory cells programmed to store three bits, four bits, or other bits of data. Gray code encoding values 718 may be as illustrated for the set of memory states 720 storing three bits of data.

"Set of memory states" refers to two or more memory states that a memory cell may have when the memory cell is programmed and/or erased. In certain embodiments, the number of memory states in the set of memory states depends on the number of data bits that can be represented by each memory cell. For example, a memory cell (SLC) that stores one bit may have two memory states. A memory cell (MLC) that stores two bits may have four memory states. A memory cell (TLC) that stores three bits may have eight memory states. A memory cell (QLC) that stores four bits may have sixteen memory states. A memory cell that stores five bits may have thirty-two memory states.

Prior to programming memory cells, the memory cells in the programming operation may be in the erased state Er 702. Each programmed state is associated with a respective verify voltage level Vv (e.g., VvA, VvB, etc., as illustrated). A given target memory cell is programmed in its assigned memory state when its threshold voltage Vt is above the verify voltage level Vv asso-ciated with the memory state assigned to that target memory cell.

During a read operation to read data stored in target memory cells of a page, a sense circuit (e.g., sense blocks of the read/write circuits 214 illustrated in FIG. 2) may be configured to perform a sense operation that senses whether current flows through the bit lines connected to the target memory cells of the page. The voltage supply circuitry (e.g. Bias source) may supply voltages on selected word lines and unselected word lines at appropriate levels that cause current to flow, or to not flow, based on the threshold voltage Vt of the target memory cells. For some configurations, the level of the voltage supplied to the selected word lines may vary depending on the states of the memory cells.

A driver circuit may bias bit lines so that a sufficient voltage is applied to the drain side of the bit lines and the cell source voltage Vcelsrc is applied to the source side of the bit lines to allow for current flow, provided that the threshold voltage Vt of the selected memory cell allows for it. "Driver circuit" refers to a circuit, sub-circuit, electronic component, hardware, software, firmware, module, logic, device, or apparatus configured, programmed, designed, arranged, or engineered to supply a voltage, either in analog or digital wave form, to another circuit, sub-circuit, electronic component, logic, device, or apparatus.

In certain embodiments, a driver circuit supplies, or drives, a single voltage to another circuit at a predefined magnitude and for a predefined duration, or at an initial magnitude that ramps up (or charge) to the predefined magnitude. In certain embodiments, a driver circuit supplies or drives a single voltage to another circuit at a predefined magnitude and then ramps down (or discharge) from the predefined magnitude to a target magnitude.

In another embodiment, a driver circuit supplies a plurality of different voltages to a plurality of circuits. Certain of the plurality of different voltages may be analog voltages and certain of the plurality of different voltages may ramp up to one or more target voltages and certain of the plurality of different voltages may ramp down to one or more target voltages.

"Selected memory cells" refers to one or more memory cells that are selected to change programming state by way of a program pulse and/or program storage operation.

In a NAND memory array, a set of selected memory cells may be a memory cells positioned along a selected word line that are identified to receive a program pulse as part of a program verify operation in order to program memory cells of the selected word line to one or more target data states. A selected memory cell, in one embodiment, is a memory cell along the selected word line that has either not yet reached its target data state.

The driver circuit may supply the voltages to the selected and unselected word lines and to certain bit lines at levels in various combinations and/or in various sequences and/or over various sense operations.

"Ramp" refers to the act of biasing a structure from an initial voltage level to a target voltage level. Typically, the initial voltage level is low, such as ground or at nearly zero volts, and the target voltage level is higher than the initial voltage level. In such instances, the term 'ramp' may be used together with the term 'up' to indicate this relationship. However, ramp may be used herein to describe an act of biasing, or driving, or discharging a structure from an initial voltage level to a target voltage level where the target voltage level is less than an initial voltage level. In such instances, the term 'ramp' may be used alone or the action may be referred to as 'ramping down'.

FIG. 7 illustrates that memory cells programed to memory states Er, A, B, and C have lower threshold voltages than memory cells programmed to memory states D, E, F, and G. Memory cells of a word line programmed to the higher threshold voltage memory state (e.g., D, E, F, and G) tend to cause more program disturb to memory cells of a word line that was programmed just before a selected word line currently being programmed. Using a normal order programming (NOP) word line programming order, programming of WLn of FIG. 4 may cause program disturb to WLn−1. Using a reverse order programming (ROP) word line programming order, programming of WLn−1 of FIG. 4 may cause program disturb to WLn. This program disturb is particularly problematic for memory cells of a word line that have a low threshold voltage (e.g., Er, A, B, and C).

Like this program disturb, a coupling effect within a channel may cause memory cells with a low threshold voltage (e.g., those in an Erased state closest to the source side) to change threshold voltage (become "programmed" to a higher threshold voltage such as an A state). This may occur during a source-side precharge stage and not a drain side precharge stage because the source side select gates may be configured with different levels of threshold voltage (See FIG. 9), while the select gates of the drain side may have similar, or the same, levels of threshold voltages. A method for source-side precharge 1700, described in relation to FIG. 17 may counteract the coupling effect in the channels.

Figure 8:
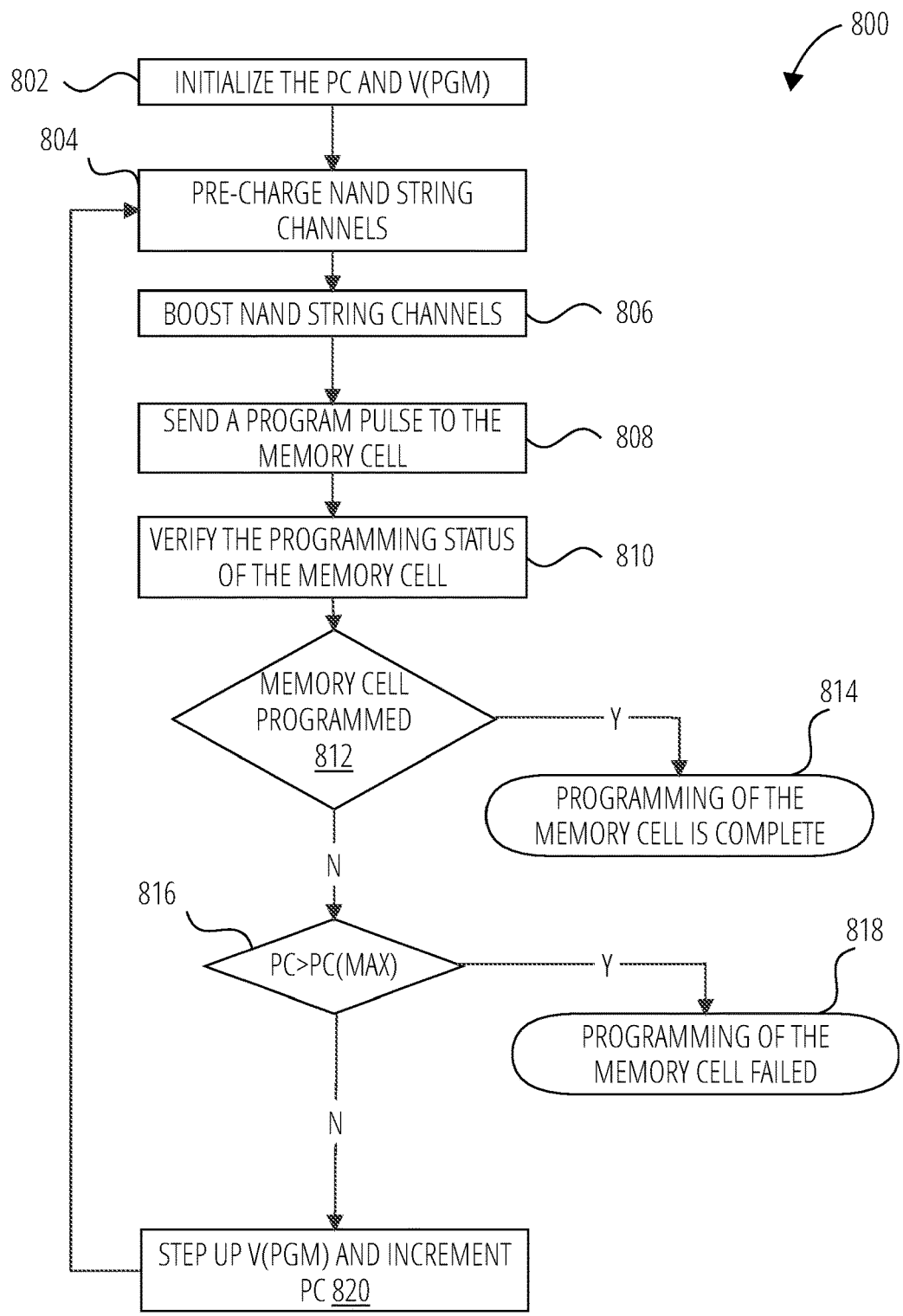
FIG. 8 illustrates a memory cell programming process 800 in accordance with one embodiment.

FIG. 8 is a flowchart illustrating one embodiment of a memory cell programming process 800. The memory cell programming process 800 may be performed by a controller, such as a die controller. At block 802, the PROGRAM voltage (Vpgm) and program counter (PC) may be set to initial values. V(pgm) is the PROGRAM voltage that will be applied to the selected word line for the first iteration of the memory cell programming process 800. This PROGRAM voltage may be stepped up iteratively during the process. The program counter tracks how many program pulses have been applied, such that programming can be canceled if the memory cell does not program within an allowed number of program pulses.

In one embodiment, an initial value for boosting voltages may also be established at block 802. The value of boosting voltages may depend on the magnitude of the PROGRAM voltage. For example, as the PROGRAM voltage increases in magnitude during the process, the magnitude of boosting voltages may also be stepped up.

The value of boosting voltages may depend on the location of the word line relative to the word line selected for programming. Depending on the implementation, the magnitude of the boosting voltage (in a given program loop) for drain side word lines may be smaller, larger, or the same as the boosting voltage for source side word lines. Also, in some implementations, using a slightly greater magnitude boosting voltage on word lines near the selected word line may help reduce a potential gradient in the NAND string channel near the selected word line, and thus may reduce an incidence of hot electrons in the channel.

At block 804, NAND string channels of the memory array may be pre-charged. This is referred to herein as a precharge stage. The precharge stage may involve establishing one or more pre-charge voltages in the channel of NAND strings, such that certain NAND strings may be inhibited from programming when a programming pulse is applied to the selected word line. In certain embodiments, the architecture of the memory array may include each NAND string channel connected to a common source line on the source side of the NAND string channels such that all channels are pre-charged together. Consequently, in such an embodiment, when the programming sequence is from the drain side toward the source side, each channel may get pre-charged.

In another embodiment, the architecture of the memory array may include each NAND string channel connected to separate source line control line(s) on the source side of the NAND string channels such that channels may be selectively pre-charged. Consequently, in such an embodiment, when the programming sequence is from the drain side toward the source side, specific channels may get pre-charged, while others are not. For example, channels that are not being programmed may selectively not be pre-charged, in such embodiments.

At block 806, the voltage in channels of program inhibited NAND strings may be boosted (this may simply be referred to as "channel boosting" or "boosting stage"). A program inhibited NAND string is one that does not have a memory cell being programmed along the selected word line. That is, the program pulse to be applied to the selected word line may not, in intended implementations, alter the threshold voltage of memory cells on an unselected NAND string. Such a memory cell is also referred to herein as an unselected memory cell. Boosting the channels of program inhibited NAND strings may help prevent program disturb.

At block 808, a program pulse (e.g., programming voltage) may be applied to the selected word line while the channels of the program inhibited NAND strings may be boosted. Also, a "program enable" voltage may be applied to bit lines associated with NAND strings having a memory cell to receive programming (e.g., selected memory cells). By receiving the programming pulse, the memory cell may have its threshold voltage altered. For some architectures, the program inhibit voltage may be about 2.2V, but this may vary based on design. Bit lines associated with memory cells being programmed may be kept at a program enable voltage. For some implementations, the program enable voltage may be about 0V, but this may vary based on design.

At block 810, a verification process may be performed to determine whether or not a memory cell has been programmed to a target threshold voltage. At decision block 812, if verification passes, the programming process may be completed successfully (status=pass) at block 814. If a sufficient number of the memory cells were not verified as programmed at decision block 812, then the die controller may determine whether the program loop counter (PC) is less than a maximum value PC(MAX) at decision block 816. The value PC(MAX) may for example fall between three and six in some implementations.

If the program counter (PC) is greater than the maximum count PC(MAX) at decision block 816, then the program process may be considered to have failed (block 818). If the program counter (PC) is less than a maximum value (e.g., 6), then the program counter (PC) may be incremented by 1, and the programming voltage Vpgm may be stepped up to the next value at block 820. In some embodiments, the boosting voltages may also be stepped up at block 820. Subsequent to block 820, the process may loop back to block 804 to prepare for and apply the next program pulse to the selected word line.

After the programming pass is completed, the data may be read from the memory cells using read reference voltages that lie within the programmed threshold voltage distributions of the memory cells. By testing whether the threshold voltage of a given memory cell is above or below one or more of the read reference voltages, the die controller may determine the stored value which is represented by the threshold voltage of a memory cell.

If the memory cell fails to program correctly, Vpgm may have reached its highest value and the threshold voltage on the memory cell may be higher than that of a normally programmed memory cell. This may result in a distribution of threshold voltages on memory cells in a particular memory region (e.g., a FLASH memory block) where some number of memory cells may have a threshold voltage higher than may be found on a successfully programmed memory cell. Such cells may be referred to as over-programmed memory cells by persons skilled in the art.

Figure 9:
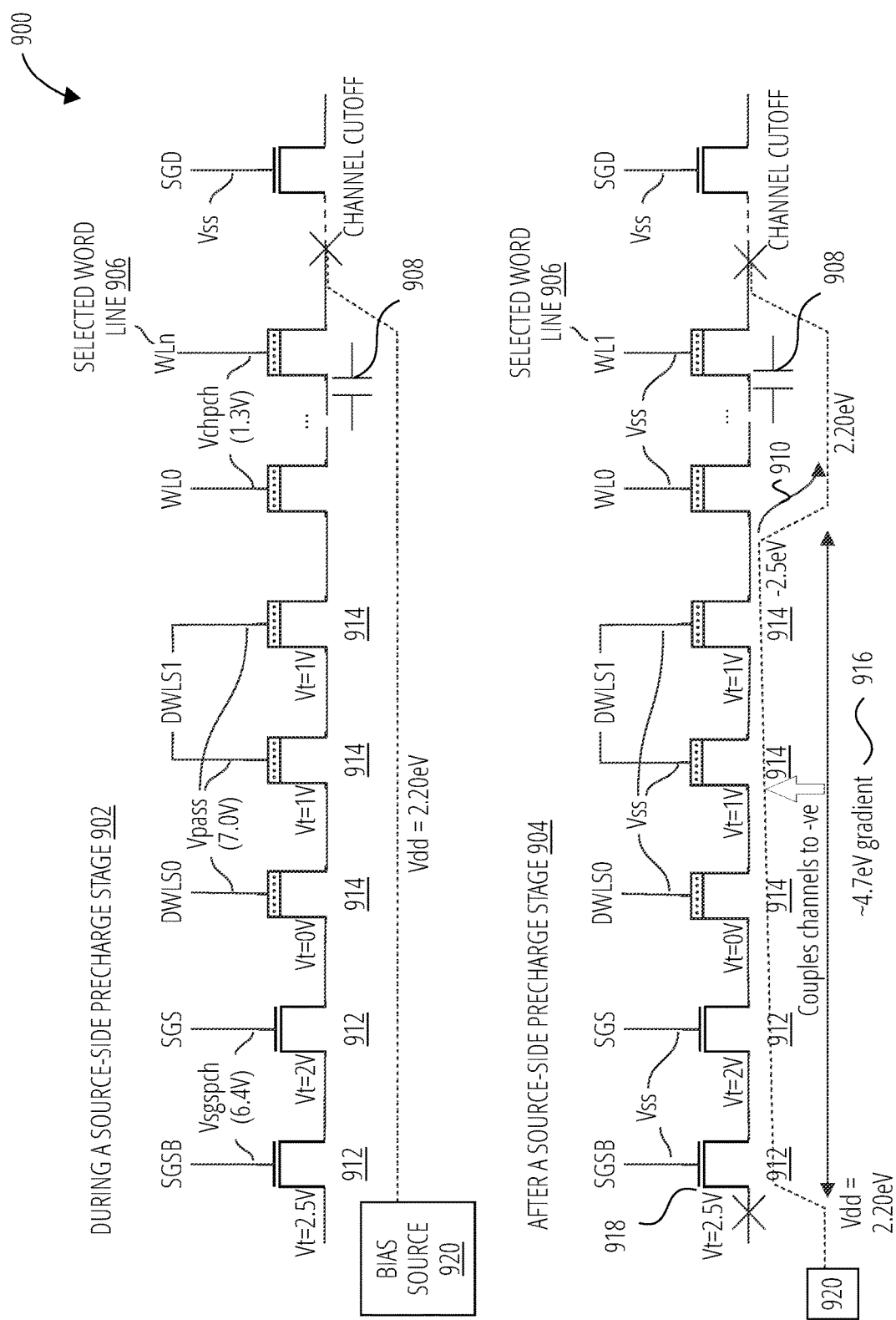
FIG. 9 illustrates a NAND string during and after a precharge stage 900 in accordance with one embodiment.

FIG. 9 illustrates a NAND string during and after a precharge stage 900 in accordance with one embodiment. A NAND string having multiple source-side select gates 912 and dummy word line select gates 914 is shown in a state during a source-side precharge stage 902 and after a source-side precharge stage 904.

During a source-side precharge stage 902, the source-side select gates 912 SGSB and SGS have a threshold voltage of 2.5V and 2V respectively, and may be turned on by an SGS precharge signal (e.g., voltage) Vsgspch supplied to the SGSB and SGS via control lines. The SGS precharge signal Vsgspch may, for example, be a voltage of about 6.4V. Dummy word line select gates 914 (source side) DWLS0 and DWLS1, having threshold voltages of 0V and 1V respectively, may be turned on by a pass voltage Vpass. This pass voltage Vpass may, for example, be about 7.0V. This enables a source line voltage Vdd of, for example, 2.20 eV, applied on the source line, to pass into the channel to raise a potential of the channel beneath, and/or around, the word lines (WL0 and WLn). "Dummy word line select gate" refers to a select gate coupled to a dummy word line.

Unselected word line WL0 and selected word line WLn, which have erased memory cells due to ROP programming, may be turned on by a relatively low voltage such as channel precharge voltage signal Vchpch of, e.g., 1.3V. Activating the memory cells of WL0 and WLn permits the precharge potential Vdd to rise below, and/or around, the selected word line WLn. WLn is the word line to be programmed, selected word line 906. Select gates on the drain side are turned off during the precharge stage so that the channel potential increases. Thus, SGD select gate is biased to Vss, about 0 volts, which cuts off, disconnects/decouples, the channel on the drain side. This enables a potential in the channel of the NAND string to rise to Vdd, or about 2.20 eV. The raised channel potential provides the precharge needed to raise the channel potential high enough during the boosting stage to effectively inhibit programming for memory cells of a selected word line 906 that are unselected memory cells during a particular programming phase, of a multi-programming phase programming storage operation.

The precharge potential and/or voltages on the word lines and/or select gates may be provided by a bias source 920. "Bias source" refers to a set of circuits, circuitry, logic, or components configured to supply a voltage to one or more components of a memory array. The bias source may convey the voltage using one or more control lines. Certain control lines may have a specific name based on what parts of the memory array the control line controls for example word lines and bit lines are types of control lines.

The magnitude of the voltage supplied by the bias source and whether the voltage level supplied is increasing or decreasing depends on the operation that a controller is implementing. At one point during an operation, the voltage level provided by the bias source may comprise an analog signal increasing from ground or zero voltage, or a level substantially close to zero, to a desired voltage level required by components coupled to the bias source to implement the desired operation. As the voltage applied to a component coupled to the bias source increases, the period of time during which the voltage level is changing is referred to herein as charging, pre-charging, or ramping up.

At another point during an operation, the voltage level provided by the bias source may comprise an analog signal configured to maintain a voltage level required by components coupled to the bias source for a particular stage of implementing a desired operation. As the voltage applied to a component coupled to the bias source remains substantially at the desired voltage level, the period of time is referred to herein as a steady state or stable.

At another point during an operation, the voltage level provided by the bias source may comprise an analog signal decreasing from a desired voltage level to a lower voltage level, a ground level, or zero voltage, or a level substantially close to zero, for a desired operation. As the voltage applied to a component coupled to the bias source decreases, the period during which the voltage level is changing is referred to herein as discharging, post-charging, or ramping down. A boosting capacitance 908 may be inherent in the channel such that added precharge potential is stored for some period, and available to assist to inhibit boosting during programming.

After a source-side precharge stage 904, analog signals/voltage on source side select gates such as source control lines SGSB and SGS and/or dummy word line select gates (e.g., SGSB, SGS, DWLS0, and DWLS1) is ramped down to Vss, about 0V. As the voltage on the source side select gates decreases, certain select gates turn off the associated transistor before others.

Specifically, if the ramp down rate is the same for all the source side select gates, the source side select gate and associated transistor with a highest threshold voltage turns off first, which cuts off/turns off the channel and may isolate the channel (e.g., causes the channel to float). In the example of FIG. 9, the SGSB source side select gate is the highest threshold voltage gate 918, having a Vt of 2.5V as illustrated, and is thus the fastest (e.g., earliest) gate to shut off.

With the channel floating (both the drain side and source side turned off) the potential (e.g., voltage) within the channel that was built up during the precharge stage begins to couple toward a negative potential due to the influence of the voltage still ramping down on the source side select gates that have not yet turned off. In this example, source side select gates SGS, DWLS0, DWLS1 are ramping down but still have a voltage between about 7.0V and 0V (Vss). This influence negatively couples the channel under the dummy word lines to about a −2.5 eV potential, which creates a potential gradient 916 in the channel between DWL1 and WL0. This is illustrated in the ~4.7 eV difference between the 2.20 eV Vdd shown on the source side. In one embodiment, this coupling effect may negate the potential in the channel created during the precharge stage.

Consequently, on the lower word lines (e.g., WL0, WL1, . . . WLn, etc.), the boosting capacitance 908 is smaller than is inherent in the middle and upper word lines. As a result, boost leakage 910 may be induced beneath the lower word lines due to the potential gradient 916. This boost leakage 910 may cause the threshold voltage of erased cells on lower word lines to change to a higher threshold voltage state due to program disturb during the application of a program pulse during a program storage operation.

In one embodiment of the claimed solution, the die controller 206 may be configured to mitigate formation of the potential gradient 916 in the channel of NAND strings of a memory array during a precharge stage of a program storage operation. In another embodiment of the claimed solution, the die controller 206 may be configured to precharge and boost a voltage within NAND strings of an unselected memory cell along a selected word line such that the unselected memory cell is inhibited from programming. In one or more embodiments, mitigation of a potential gradient 916 may be accomplished by managing how, and/or when, source side select gates discharge relative to each other as a precharge stage completes.

In one or more other embodiments, the precharge and/or boosting of voltage within NAND strings may be performed such that unselected memory cells of a selected word line are inhibited from programming when a programming pulse is applied to the selected word line. In embodiments in which the die controller implements a source-side precharge stage, the die controller may inhibit programming of the unselected memory cells of a selected word line by mitigating coupling effects of channels for the unselected memory cells during a programming storage operation. The die controller may mitigate coupling effects by managing when and how the channels are cut off from the source line.

Figure 10:
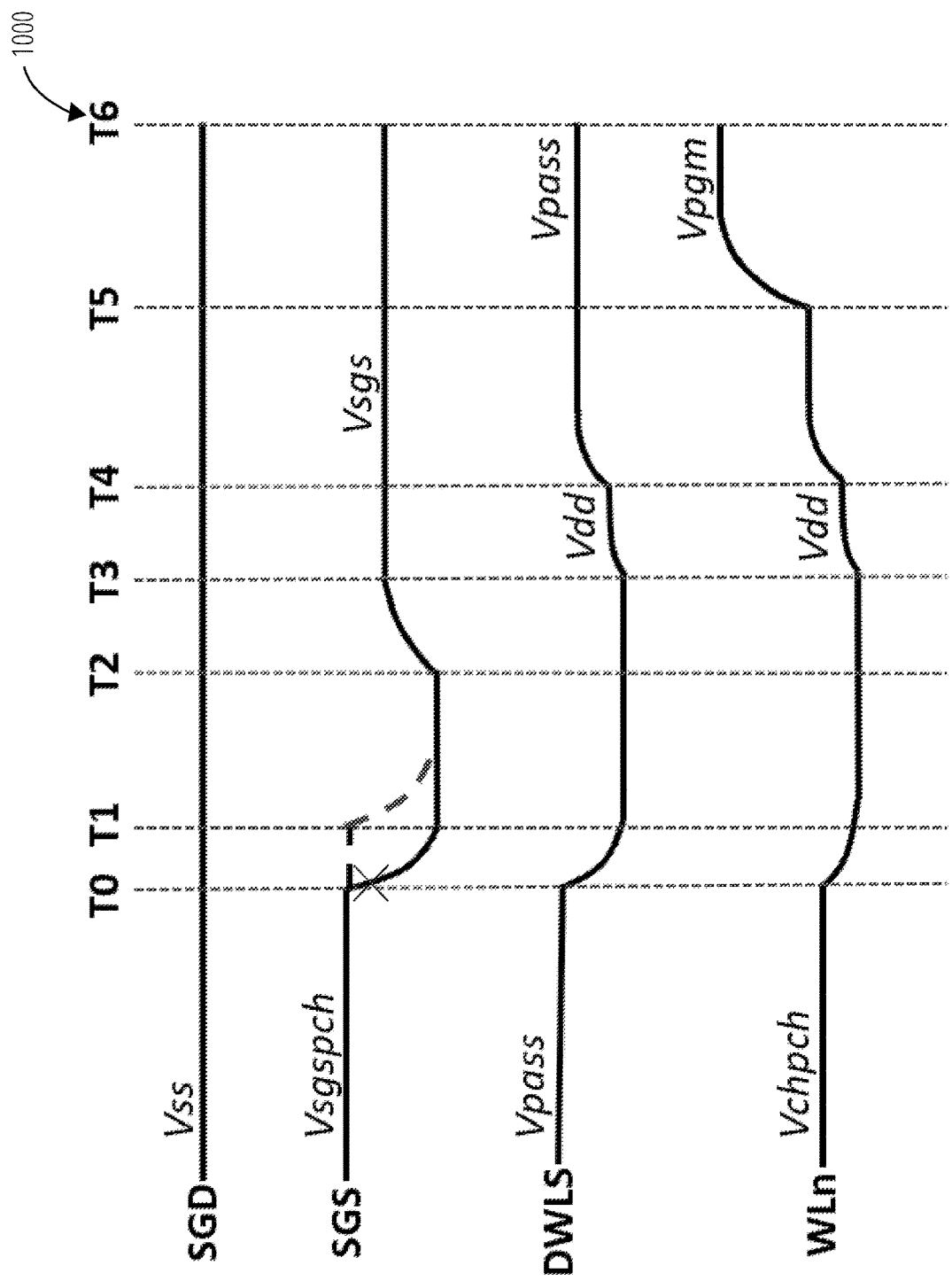
FIG. 10 illustrates a delayed discharge sequence 1000 in accordance with one embodiment.

FIG. 10 illustrates a delayed discharge sequence 1000 in accordance with one embodiment showing waveforms on a timeline from T0-T6. "Discharge sequence" refers to a sequence or order for performing a discharge operation. A discharge sequence may be used in relation to discharging a voltage that is present in, or was applied to, an electrical component or circuit such as a control line, a select gate, and/or a transistor. The electrical component(s) or circuit(s) discharged may be discharged separately in a particular sequential order or two or more of them may be discharged together in a particular sequential order.

This delayed discharge sequence 1000 may be implemented after precharging a three-dimensional memory array, or as a precharge stage completes, as part of ROP program storage operations. Such a three-dimensional memory array may be similar to that illustrated in FIG. 4 and may comprise at least one dummy word line positioned between the source-side select gate of each NAND string and the word lines. The at least one dummy word line may be coupled to the channel of each NAND string by way of a dummy word line select gate. The source-side select gate SGS may have a first threshold voltage and the dummy word line D 710 may have a second threshold voltage.

In delayed discharge sequence 1000, SGD indicates the signal applied to the drain-side select gate (if there are more than one SGD, each may receive the same SGD signal illustrated), SGS indicates the signal applied to the source-side select gate during the timeline T0-T6. DWLS represents the signal applied to the at least one dummy word line on the source side, and WLn represents the signal applied on the word line selected for programming before and during the timeline T0-T6.

In one embodiment, the precharge stage of ROP operations may end at time T0. In another embodiment, the precharge stage of ROP operations may end at time T1 and the claimed solutions described herein may be applied as the precharge stage is completed.

At T0, a discharge circuit configured within the die controller may discharge the SGS and the DWLS together (shown by the solid black lines), which may result erase upper tail problems as previously discussed. When discharged together, the SGS may cut off before the DWLS, due to the higher Vt (illustrated by the "x" and solid line SGS).

In embodiments of the claimed solution, however, the discharge circuit may be configured to discharge the source-side select gate SGS after discharging the at least one dummy word line select gate (shown in FIG. 10 by the dashed line starting after time T0). The SGS may be discharged after the at least one dummy word line select gate because the first threshold voltage (of the source-side select gate SGS) is greater than the second threshold voltage (of the dummy word line select gate DWLS).

In embodiments having a plurality of source-side select gates and a plurality of source side dummy word line select gates, the discharge circuit may be configured to discharge the plurality of source-side select gates after discharging the plurality of source side dummy word line select gates, if the threshold voltages of the plurality of source-side select gates is greater than the threshold voltages of the plurality of source side dummy word line select gates.

Delaying the discharge of Vsgspch from SGS until after time T0, such as for example, T1, when Vpass on DWLS is substantially discharged, may prevent, or mitigate, the boost leakage 910 described with regard to FIG. 9 by reducing, or eliminating, the creation of a potential gradient 916 as the source-side select gates discharge. The staggering of the timing for the discharge of the source-side select gate SGS keeps the channel coupled to the source line which mitigates the impact of the voltage on the DWLS and mitigates or prevents the channel from experiencing negative coupling.

As a result, an adequate precharge is maintained within the channel during preparation for the boosting stage at T2 and T3 and the boosting stage itself. "Boosting stage" refers to a stage within a programming operation in which a voltage within one or more components of a memory array is raised to target level for a particular period of time.

In one embodiment, a boosting stage is used prior to programming selected memory cells of a selected word line. In such an embodiment, the voltage in a channel is raised high enough that memory cells coupled to the selected word line will be inhibited from changing their programming state (e.g., for NAND memory cells, the threshold voltage). By raising the voltage of the channel and then permitting the channel to float, the voltage difference between the channel and a programming pulse applied on a selected word line is minimized such that programming of unselected memory cells is mitigated.

In one embodiment, the boosting stage may begin at time T4. When the boosting voltage Vdd is applied at T4, channels for unselected memory cells may be boosted sufficient to inhibit programming between T5 and T6, when the Vpgm programming voltage is applied to the selected word line 906 (WLn).

Figure 11:
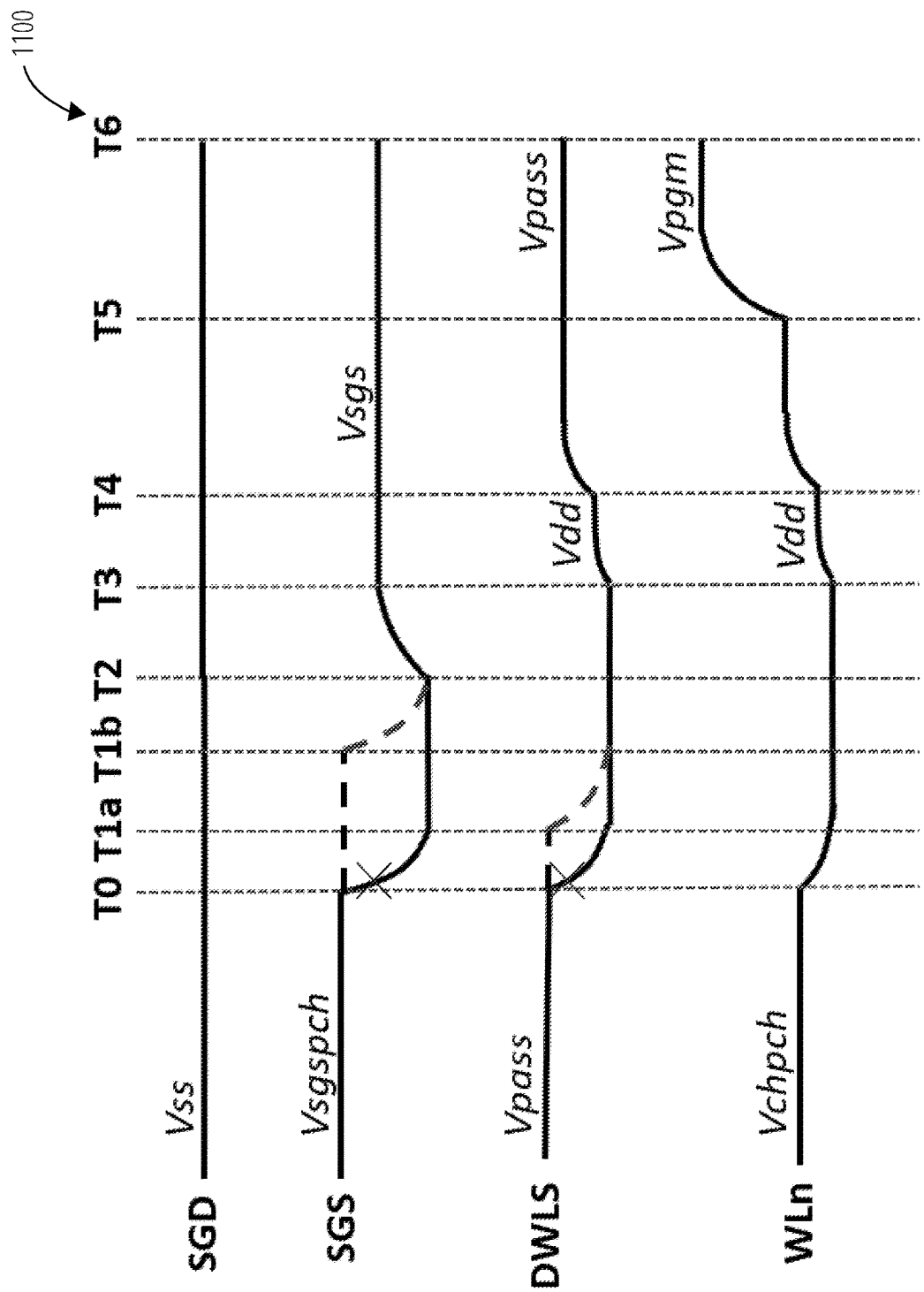
FIG. 11 illustrates a delayed discharge sequence 1100 in accordance with one embodiment.

FIG. 11 illustrates a delayed discharge sequence 1100 in accordance with one embodiment showing waveforms on a timeline from T0-T6. "Discharge sequence" refers to a sequence or order for performing a discharge operation. A discharge sequence may be used in relation to discharging a voltage that is present in, or was applied to, an electrical component or circuit such as a control line, a select gate, and/or a transistor. The electrical component(s) or circuit(s) discharged may be discharged separately in a particular sequential order or two or more of them may be discharged together in a particular sequential order.

This delayed discharge sequence 1100 may be implemented after precharging a three-dimensional memory array, or as a precharge stage completes, as part of ROP program storage operations. Such a three-dimensional memory array may be similar to that illustrated in FIG. 4 and may comprise at least one dummy word line positioned between the source-side select gate of each NAND string and the word lines. The at least one dummy word line may be coupled to the channel of each NAND string by way of a dummy word line select gate. The source-side select gate SGS may have a first threshold voltage and the dummy word line D 710 may have a second threshold voltage.

In delayed discharge sequence 1100, SGD indicates the signal applied to the drain-side select gate (if there are more than one SGD, each may receive the same SGD signal illustrated), SGS indicates the signal applied to the source-side select gate during the timeline T0-T6. DWLS represents the signal applied to the at least one dummy word line on the source side, and WLn represents the signal applied on the word line selected for programming before and during the timeline T0-T6.

In one embodiment, the precharge stage of ROP operations may end at time T0. In another embodiment, the precharge stage of ROP operations may end at time T1 and the claimed solutions described herein may be applied as the precharge stage is completed.

At T0, a discharge circuit configured within the die controller may discharge the SGS and the DWLS together (shown by the solid black lines), which may result erase upper tail problems as previously discussed. When discharged together, the SGS may cut off before the DWLS, due to the higher Vt (illustrated by the "x" and solid line SGS). In addition the DWLS may cut off before the selected word line, due to the higher Vt (illustrated by the "x" and solid line on signal DWLS).

In illustrated embodiments, however, the discharge circuit may be configured to discharge the selected word line WLn first (shown in FIG. 11 by the dashed line starting after time T0), then the at least one dummy word line select gate (shown in FIG. 11 by the dashed line starting after time T1a), then the source-side select gate SGS (shown in FIG. 11 by the dashed line starting after time T1b). The discharge sequence may be staggered such that the SGS discharges last after the at least one dummy word line select gate and the selected word line. In certain embodiments, this discharge sequence may be used because the threshold voltage of the dummy word line select gate DWLS may be greater than the selected word line and the threshold voltage of the source-side select gate SGS may be greater than the threshold voltage of the dummy word line select gate DWLS.

Delaying the discharge of Vsgspch from SGS until after time T0, such as for example, T1a and T1b, when Vpass on DWLS is substantially discharged, may prevent, or mitigate, the boost leakage 910 described with regard to FIG. 9 by reducing, or eliminating, the creation of a potential gradient 916 as the source-side select gates discharge. The staggering of the timing for the discharge of the source-side select gate SGS keeps the channel coupled to the source line which mitigates the impact of the voltage on the DWLS and mitigates or prevents the channel from experiencing negative coupling.

As a result, an adequate precharge is maintained within the channel during preparation for the boosting stage at T2 and T3 and the boosting stage itself. "Boosting stage" refers to a stage within a programming operation in which a voltage within one or more components of a memory array is raised to target level for a particular period of time.

In one embodiment, a boosting stage is used prior to programming selected memory cells of a selected word line. In such an embodiment, the voltage in a channel is raised high enough that memory cells coupled to the selected word line will be inhibited from changing their programming state (e.g., for NAND memory cells, the threshold voltage). By raising the voltage of the channel and then permitting the channel to float, the voltage difference between the channel and a programming pulse applied on a selected word line is minimized such that programming of unselected memory cells is mitigated.

In one embodiment, the boosting stage may begin at time T4. When the boosting voltage Vdd is applied at T4, channels for unselected memory cells may be boosted sufficient to inhibit programming between T5 and T6, when the Vpgm programming voltage is applied to the selected word line 906 (WLn).

Figure 12:
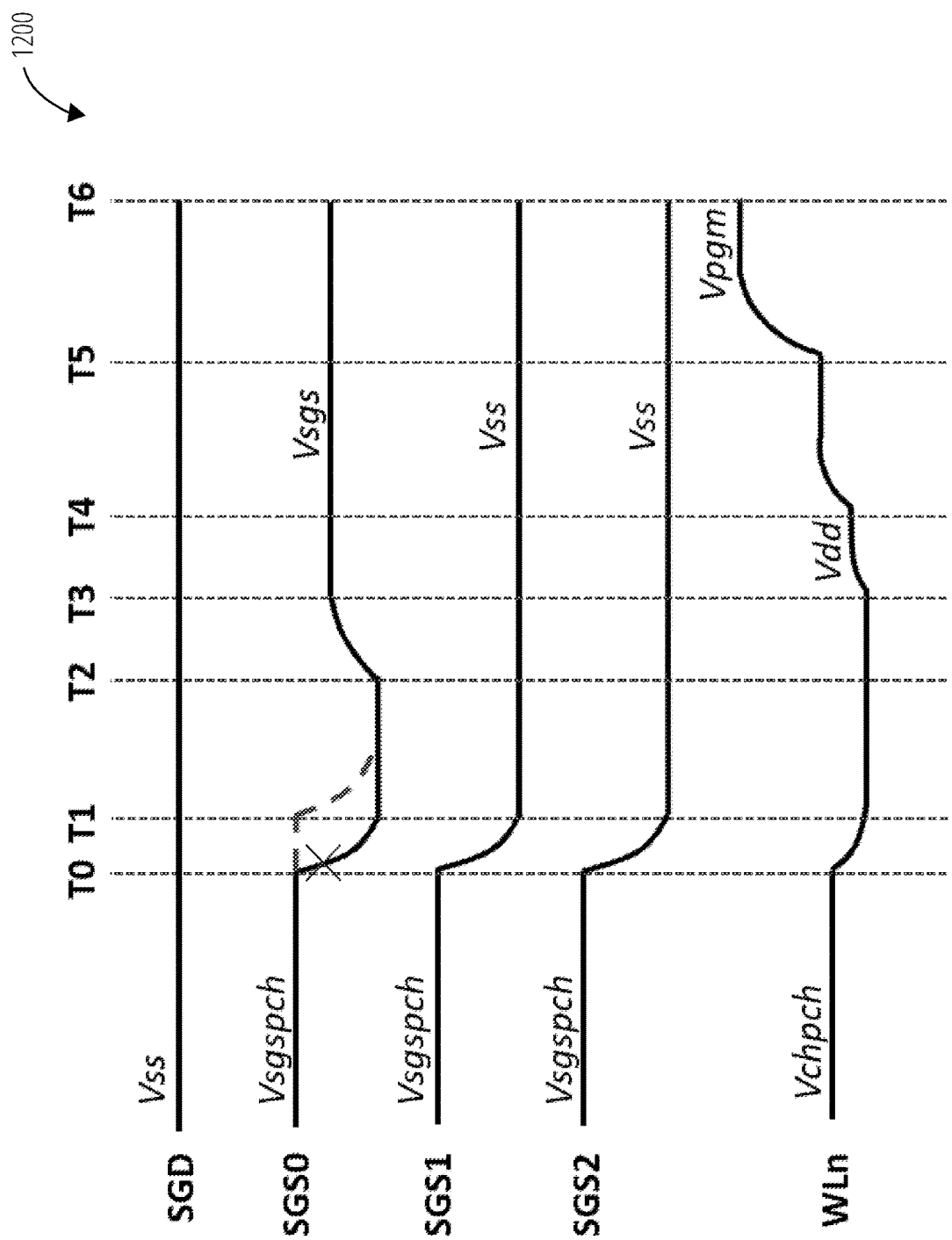
FIG. 12 illustrates a delayed discharge sequence 1200 in accordance with one embodiment.

FIG. 12 illustrates a delayed discharge sequence 1200 in accordance with one embodiment showing waveforms on a timeline from T0-T6. This delayed discharge sequence 1200 may be implemented by a three-dimensional memory array wherein the source-side select gate comprises a plurality of source-side select gates (e.g., SGS0, SGS1, SGS2) coupled to each NAND string. In the illustrated embodiment, the memory array may include no dummy word line and a source-side select gate may be implemented using a plurality of source-side select gates (e.g., SGS0, SGS1, SGS2).

In one embodiment, one source-side select gate of the plurality of source-side select gates (e.g., SGS0, SGS1, SGS2) may have a higher threshold voltage than the other select gates. For example, suppose SGS0 has a Vt of 2.5V and SGS1 has a Vt of 2.0V and SGS2 has a Vt of 2.0V. In such a configuration, if the die controller discharges SGS0, SGS1, and SGS2 together, SGS0 will turn off its associated transistor before SGS1 and SGS2, due to the higher Vt (illustrated by the "x" and solid line SGS0). However, to avoid an early cut-off of the channel, the die controller in one embodiment is configured to discharge the source select gate with the highest threshold voltage after the other source side select gates have substantially discharged. This waveform is illustrated by the dashed line. In the illustrated example, the source-side select gate having the highest Vt is SGS0.

In another embodiment having waveforms similar to those illustrated in FIG. 10, the memory array may include at least one dummy word line (not shown in FIG. 12) adjacent to the word lines. Furthermore, a plurality of source-side select gates may be positioned along the NAND string between the source line and the at least one dummy word line, and each of the plurality of source-side select gates may have a different threshold voltage. SGS0, SGS1, and SGS2 represent the signals driven onto a plurality of source-side select gates (in this case, three). For example, suppose SGS0 has a Vt of 3.0V and SGS1 has a Vt of 2.5V and SGS2 has a Vt of 2.0V.

During the precharge stage preceding time T0, Vsgspch may be driven onto these source-side select gates (e.g., SGS0, SGS1, and SGS2) to allow a precharge potential to build in the channel along the NAND string. At T0, a discharge circuit of the die controller may discharge SGS1 and SGS2 together and delay discharging SGS0 (see dashed line segment) until T1 because SGS0, with a Vt of 3.0V, has a higher Vt than the Vts of SGS1 and SGS2.

By discharging a source-side select gate of the plurality of source-side select gates having a highest threshold voltage after discharging other source-side select gates of the plurality of source-side select gates, the die controller may keep the channel electrically coupled to the source line for a sufficient time period that the potential in the channel does not negatively couple due to the voltage on SGS1, SGS2, or a DWLS (not shown in FIG. 12). As a result, an adequate precharge is maintained during the programming storage operation.

Figure 13:
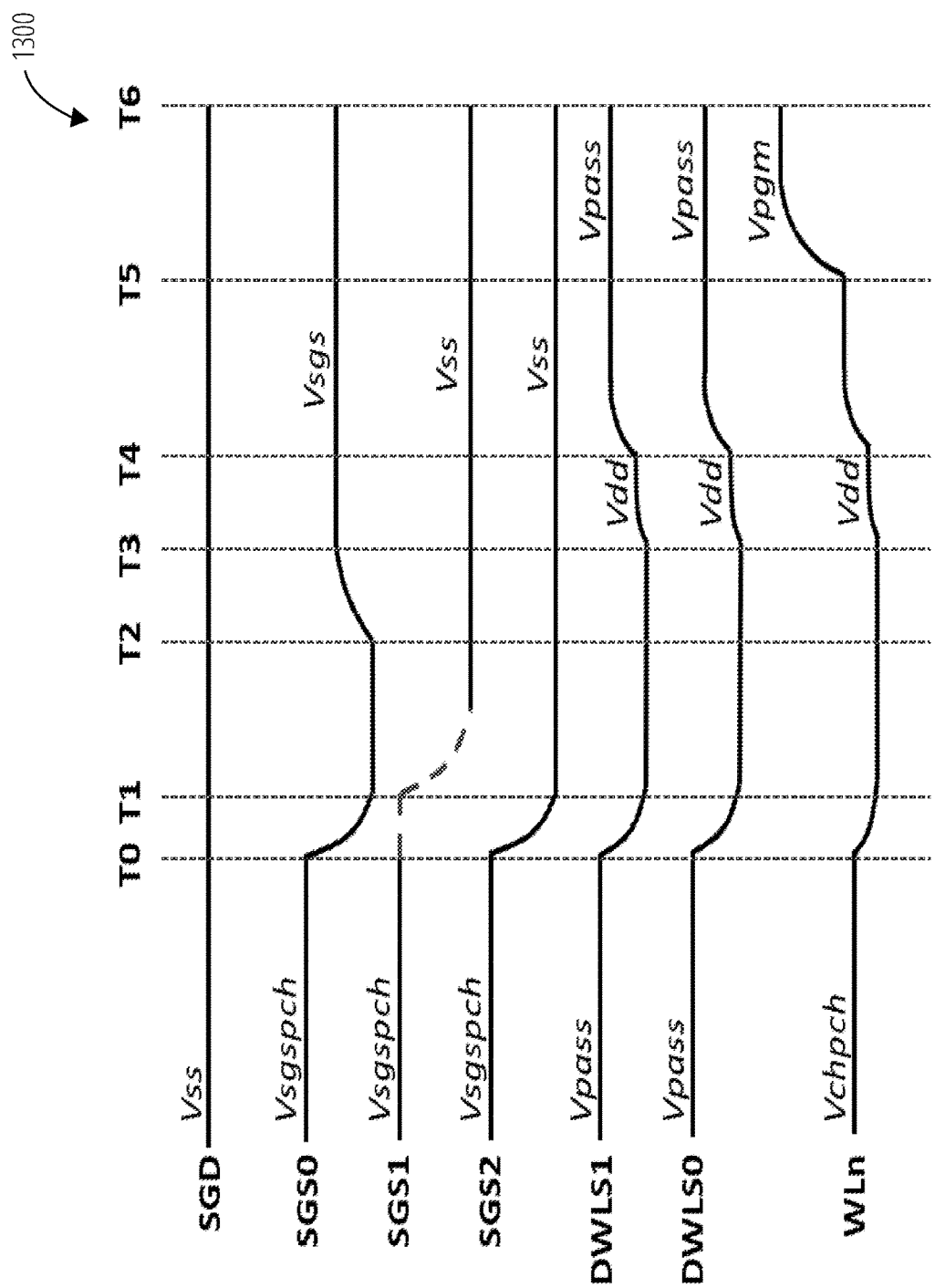
FIG. 13 illustrates a delayed discharge sequence 1300 in accordance with one embodiment.

FIG. 13 illustrates a delayed discharge sequence 1300 in accordance with one embodiment showing waveforms on a timeline from T0-T6. As in the examples of FIG. 10 and FIG. 12, the memory array for this delayed discharge sequence 1200 may include a plurality of source-side select gates SGS0-SGS2, one or more SGDs, a set of memory cells coupled to word lines, with a selected word line 906 WLn, and a plurality of dummy word lines. In this example, SGS1 has a greater threshold voltage than the dummy word lines DWLS1, DWLS0 (e.g., DWL in FIG. 10), the die controller manages the discharging of SGS1 such that the channel does not form, or minimally forms, a potential gradient near the other SGSs and DWLs during a precharge stage. The die controller may be configured to mitigate formation of a potential gradient in the channel of the NAND strings during a program storage operation precharge stage. In another embodiment, the die controller may be configured to precharge and boost a voltage within a channel of each NAND string of an unselected memory cell along a selected word line such that the unselected memory cell is inhibited from programming.

FIG. 13 illustrates the die controller discharging SGS1 after substantially discharging the other source-side select gates SGS0, SGS2 and after substantially discharging the dummy word lines DLWS0 and DWLS1. The dashed line shows the signal driven on SGS1 beginning its discharge at time T1, subsequent to SGS0, SGS2, DWLS1, and DWLS0 beginning to discharge at T0. Those of skill in the art recognize that SGS1 represents the signal delivered to a transistor by way of a control line in order to activate or deactivate the transistor and thus control whether the channel is electrically connected to the source line.

Figure 14:
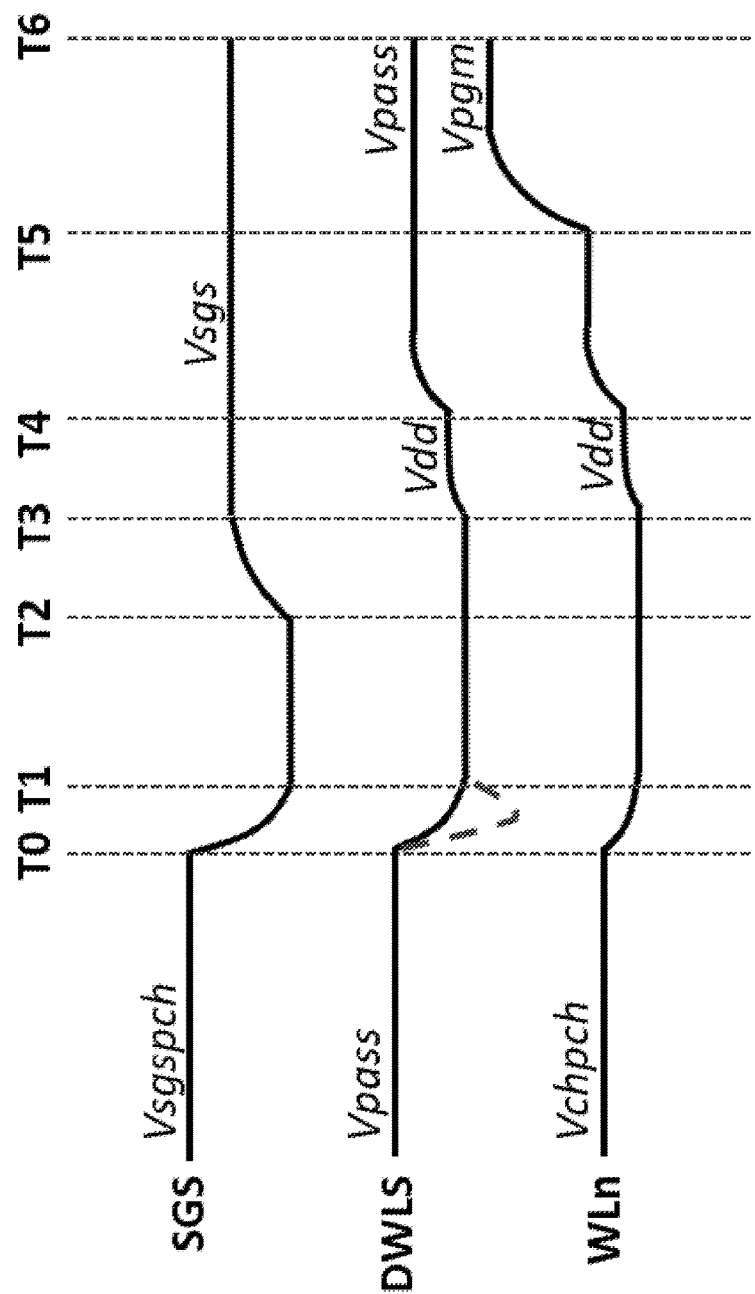
FIG. 14 illustrates a discharge sequence with a negative kick 1400 in accordance with one embodiment.

FIG. 14 illustrates a discharge sequence with a negative kick 1400 in accordance with one embodiment showing waveforms on a timeline from T0-T6. The die controller implements the discharge sequence with a negative kick 1400. The three-dimensional memory array may comprise at least one dummy word line positioned between the source-side select gate of each NAND string and the word lines. The at least one dummy word line may be coupled to the channel of each NAND string by way of a dummy word line select gate. The source-side select gate may have a first threshold voltage and the dummy word line select gate may have a second threshold voltage. The plurality of source control lines may have a first threshold voltage that is higher than the second threshold voltages of the source side dummy word lines.

In one embodiment, the discharge circuit discharges the source-side select gate SGS and the dummy word line DWLS concurrently at the end of the precharge stage. The discharge circuit may apply a negative kick to the dummy word line select gate DWLS while concurrently discharging the dummy word line select gates and the source-side select gates. The negative kick is illustrated by the dashed line on DWLS.

"Kick" refers to a voltage pulse delivered by a voltage driver, the voltage pulse is delivered at a rate and with a magnitude that is higher and faster than such voltage pulses are ordinarily delivered to the same electrical circuits or components. "Pulse" refers to an analog signal that rises quickly and then falls within a relatively short duration. In certain embodiments, a pulse may comprise a short voltage level increase that rises quickly to a peak level and then quickly falls.

"Negative kick" refers to a kick having a negative bias or negative potential. A negative kick may also include a kick that is of a sign that is opposite of the sign of biases that are ordinarily applied to a particular electrical component or control line. The negative kick may be applied in response to the first threshold voltage being greater than the second threshold voltage.

Applying the negative kick to the dummy word line DWLS may cause the DWLs to discharge faster than other source-side select gates, such as SGS. In this manner, the channel is not exposed to a potential coupling effect from the DWLS. Instead, the DWLS, which is closest to the word lines, cuts off at the same time or before the SGS, such that the channel is not exposed to a coupling effect from DWLS.

In another embodiment, the memory array may comprise a plurality of source-side select gates and a plurality of source side dummy word line select gates. In this embodiment, the plurality of source-side select gates have a higher Vt than the Vts of the plurality of source side dummy word line select gates.

In such an embodiment, the discharge circuit may apply a negative kick to the plurality of source side dummy word line select gates while concurrently discharging the dummy word line select gates and the source-side select gates. In this manner, the plurality of source side dummy word line select gates should discharge before, or no later than, the plurality of source side dummy word line select gates discharge. In this embodiment, the magnitude and duration of the negative kick is configured to cause the plurality of source side dummy word line select gates to discharge before, or no later than, the plurality of source side dummy word line select gates discharge.

By applying a negative kick, the channel precharge voltage is maintained. When the boosting voltage Vdd is applied at T6, unselected word lines may be boosted enough to inhibit programming between T5 and T6, when the Vpgm programming voltage is applied to the selected word line 906 (WLn).

Figure 15:
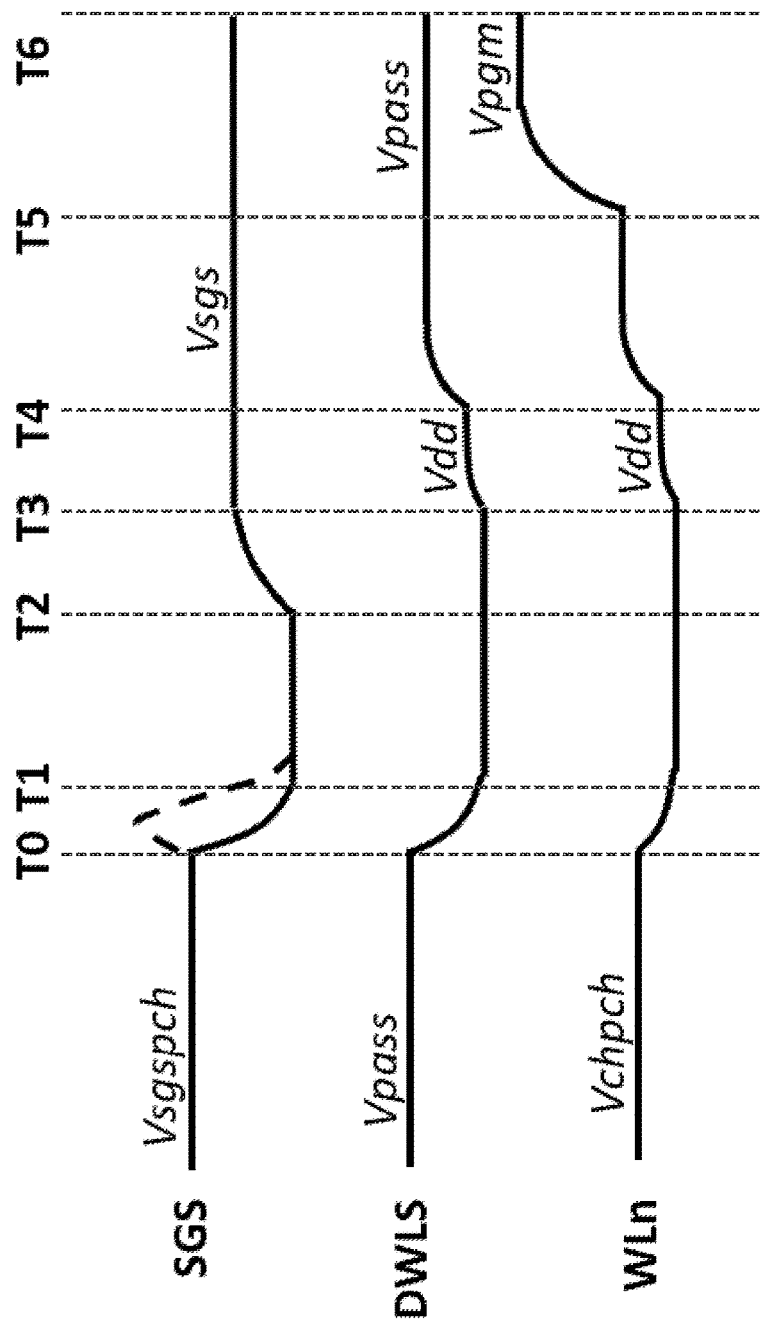
FIG. 15 illustrates a discharge sequence with a positive kick 1500 in accordance with one embodiment.

FIG. 15 illustrates a discharge sequence with a positive kick 1500 in accordance with one embodiment showing waveforms on a timeline from T0-T6. The die controller implements the discharge sequence with a positive kick 1500. The three-dimensional memory array may comprise a plurality of NAND strings each having a source-side select gate SGS, at least one dummy word line DWLS, and a plurality of word lines. In the embodiment for the illustrated waveforms, the SGS may have a higher threshold voltage that the at least one DWLS.

In one embodiment, the discharge circuit discharges the source-side select gate SGS and the at least one dummy word line DWLS concurrently at the end of the precharge stage. The discharge circuit may apply a positive kick to the source-side select gate SGS while concurrently discharging the dummy word line select gates and the source-side select gates. The positive kick is illustrated by the dashed line on SGS.

"Positive kick" refers to a kick having a positive bias. A positive kick may also include a kick that is of a sign that is the same sign as the sign of biases that are ordinarily applied to a particular electrical component or control line. In such an embodiment, the positive kick is of a magnitude and duration such that the source-side select gate SGS remains on longer than the at least one dummy word line DWLS because there is more charge to dissipate. Applying the positive kick to source-side select gate SGS may cause the SGS to discharge after the at least one dummy word line DWLS. In this manner, the channel is not exposed to a potential coupling effect from the DWLS. Instead, the DWLS, which is closest to the word lines, cuts off at the same time or before the SGS, such that the channel is not exposed to a coupling effect from DWLS.

In another embodiment having a plurality of source-side select gates and plurality of source side dummy word line select gates, the discharge circuit may apply a positive kick one or more select gates of these select gates that is a highest threshold voltage gate. The transistor associated with the select gate that is the highest threshold voltage gate may be referred to as a dominant source side transistor.

"Highest threshold voltage gate" refers to a select gate having a highest threshold voltage among a plurality of select gates that are each involved in the control of current or voltage passing into or out of a channel. "Dominant source side transistor" refers to a transistor positioned on a source side of a NAND string, the dominant source side transistor having a gate threshold voltage that is greater than a gate threshold voltage for other select gates of a plurality of source-side select gates.

The positive kick on the highest threshold voltage gate keeps the dominant source side transistor in an on state as the other source-side select gates and the source side dummy word line select gates discharge together with the dominant source side transistor. Due to the positive kick, the dominant source side transistor will naturally discharge and reach the cut off threshold voltage later than the other select gates.

By applying a positive kick, the channel precharge voltage is maintained. When the boosting voltage Vdd is applied at T6, unselected word lines may be boosted enough to inhibit programming between T5 and T6, when the Vpgm programming voltage is applied to the selected word line 906 (WLn).

Figure 16:
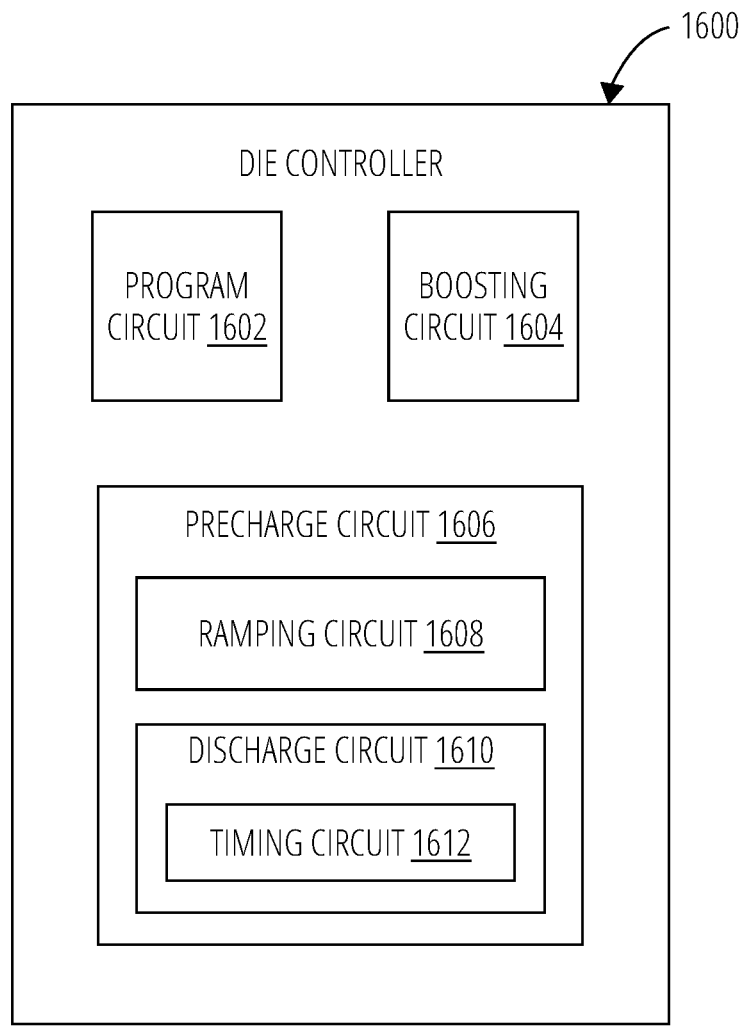
FIG. 16 illustrates a die controller 1600 in accordance with one embodiment.

FIG. 16 illustrates a die controller 1600 in accordance with one embodiment. The die controller 1600 comprises a program circuit 1602, a boosting circuit 1604, and a precharge circuit 1606. The precharge circuit 1606 may include a ramping circuit 1608 and discharge circuit 1610. The discharge circuit 1610 may be configured with a timing circuit 1612.

The program circuit 1602 serves to program memory cells of a selected word line. The boosting circuit 1604 boosts a voltage within the NAND strings in order for those NAND strings to be inhibited from programming, these NAND strings comprising unselected memory cells of the selected word line.

"Unselected memory cell" refers to a memory cell that is not selected to change its programming state. In a NAND memory array, an unselected memory cell may be a memory cell positioned along a selected word line which is included in a series or program-verify operations in order to program memory cells of the selected word line to a target data state. An unselected memory cell, in one embodiment, is a memory cell along the selected word line that has either reached its target data state, or is to remain in an unprogrammed data state. As used herein, an unselected memory cell may refer to a memory cell for which programming is to be inhibited.

In certain embodiments, the die controller 1600 includes a precharge stage. The precharge circuit 1606 may implement a source-side precharge stage in order to raise a voltage of the NAND strings to facilitate boosting of the unselected memory cells of the selected word line. The ramping circuit 1608 of the precharge circuit 1606 may raise a voltage of a plurality of source control lines (e.g., the control lines coupled to SGS0, SGS1, SGS2 of FIG. 13 before T0) and a plurality of source side dummy word lines (e.g., the control lines coupled to DWLS0, DWLS1 of FIG. 13 before T0). The discharge circuit 1610 may discharge the voltage of the plurality of source control lines and the plurality of source side dummy word lines such that the voltage within the NAND strings remains coupled to a bias source throughout the source-side precharge stage. Those of skill in the art will recognize that the this may be accomplished using various techniques.

In certain embodiments, the discharge circuit 1610 may comprise a timing circuit 1612 configured to order a discharge sequence for a at least one dummy word line and a source-side select gate. If the first threshold voltage of the source-side select gate is greater than the second threshold voltage of the at least one dummy word line, the discharge circuit 1610 organizes the discharge sequence such that the at least one dummy word line select gate discharges before the source-side select gate. In this manner, the voltage within the NAND strings remains coupled to a bias source throughout the source-side precharge stage.

In other embodiments, the timing circuit 1612 of the discharge circuit 1610 may control the signal magnitude and timing of signals for one or more control lines (e.g., the control lines coupled to select gates SGS0, SGS1, SGS2, DWLS0, DWLs1 of FIG. 13) comprising a plurality of source control lines and a plurality of source side dummy word lines. The timing circuit 1612 may be configured to order a discharge sequence for the control lines such that the control lines discharge select gates in descending order of select gate threshold voltages. For example, suppose SGS2 has a Vt of 3.0V and the other control lines SGS0, SGS1, DWLS0, DWLs1 have Vts less than 3.0V. In such a situation, the timing circuit 1612 may order the discharge sequence such that SGS2 discharges after the other control lines SGS0, SGS1, DWLS0, DWLs1. In this manner, the voltage within the NAND strings remains coupled to a bias source throughout the source-side precharge stage.

Figure 17:
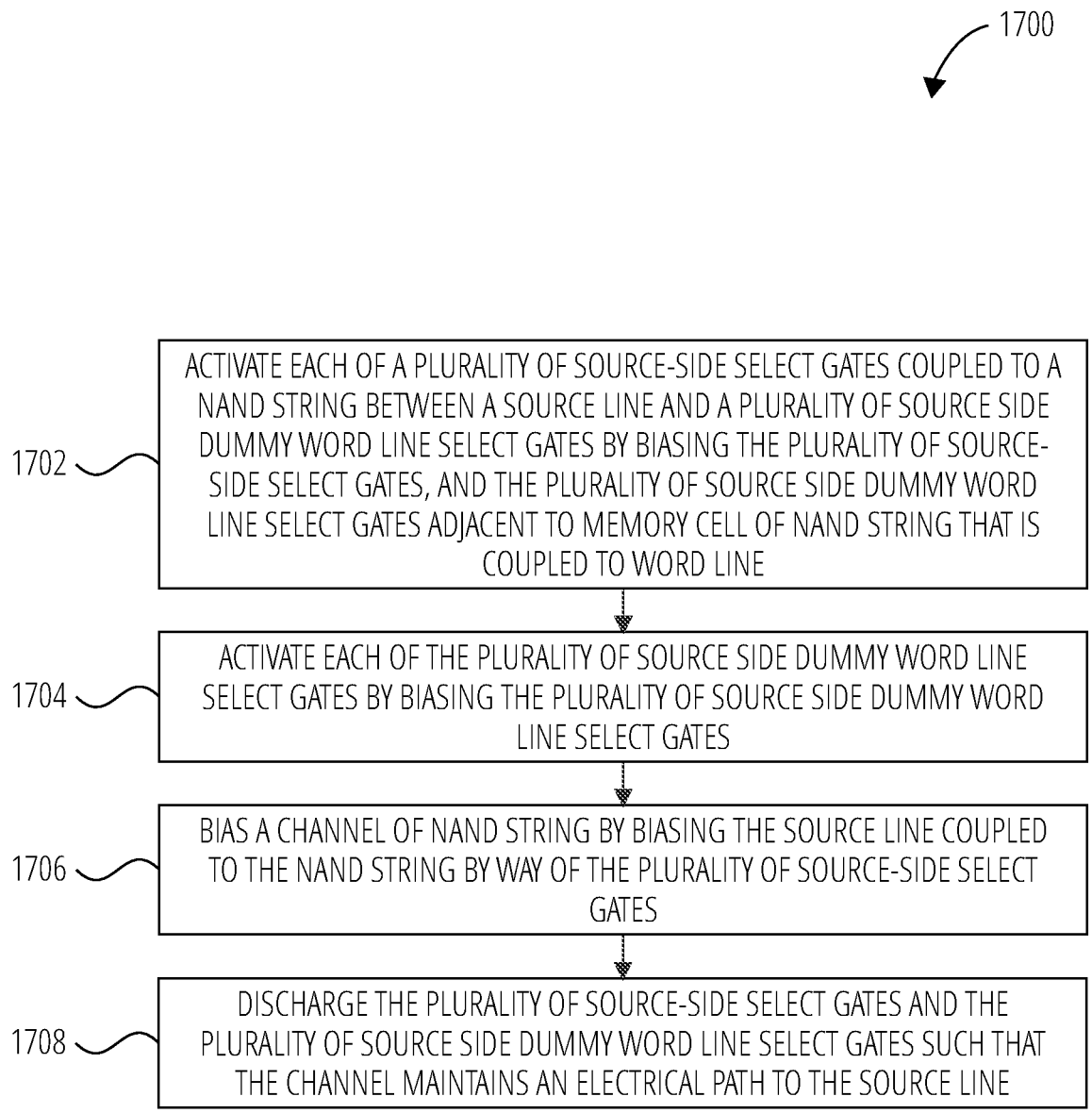
FIG. 17 illustrates a routine for retaining a bias in a channel of a NAND string during source-side precharge, in accordance with one embodiment.

FIG. 17 illustrates a method for source-side precharge 1700 in accordance with one embodiment. In block 1702, the method for source-side precharge 1700 begins with activating each of a plurality of source-side select gates coupled to a NAND string between a source line and a plurality of source side dummy word line select gates. This activation may be accomplished by biasing the plurality of source-side select gates. The plurality of source side dummy word line select gates may be adjacent to a memory cell of the NAND string, the memory cell coupled to a word line.

Each of a plurality of source side dummy word line select gates may be activated in block 1704. This activation may be accomplished by biasing the plurality of source side dummy word line select gates. In one embodiment, both the source-side select gates and the source-side dummy word line select gates may be activated at substantially the same time.

Then, in block 1706, die controller 1600 may bias the channel of the NAND string by biasing a source line coupled to the NAND string by the activated plurality of source-side select gates. In block 1708, the die controller 1600 may discharge the plurality of source-side select gates and the plurality of source side dummy word line select gates in a particular order (e.g., discharge sequence) or manner (e.g. Positive kick, negative kick) which maintains an electrical path between the channel and the source line.

Within this disclosure, different entities (which may variously be referred to as "units," "circuits," other components, etc.) may be described or claimed as "configured" to perform one or more tasks or operations. This formulation— [entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

Having thus described illustrative embodiments in detail, it will be apparent that modifications and variations are possible without departing from the scope of the invention as claimed.

What is claimed is:

1. An apparatus comprising:
 a three-dimensional memory array of NAND strings, each NAND string comprising:
 a first source-side select gate having a first threshold voltage, the first source-side select gate located on a source side of the NAND string, the first source-side select gate configured to couple the NAND string to a source line;
 a drain-side select gate on a drain side of the NAND string, the drain-side select gate configured to couple the NAND string to a bit line;

a set of memory cells positioned along the NAND string between the source-side select gate and the drain-side select gate, the memory cells coupled to word lines;

a second source-side select gate having a second threshold voltage that is greater than the first threshold voltage, the second source-side select gate located on the source side of the NAND string; and a channel that extends from the source side to the drain side of the NAND string; and one or more control circuits connected to the first and second source-side select gates to:

discharge a first voltage on the first source-side select gate at a first time, and at a second time, after discharge of the first voltage on the first source-side select gate, discharge a second voltage on the second source-side select gate during a precharge stage of a program storage operation.

2. The apparatus of claim 1, wherein the three-dimensional memory array comprises:

at least one dummy word line positioned between the first and second source-side select gates of each NAND string and the word lines, the at least one dummy word line coupled to the channel of each NAND string by way of a dummy word line select gate;

wherein the dummy word line select gate has a third threshold voltage; and wherein the one or more control circuits are configured to discharge the second source-side select gate after discharging the at least one dummy word line select gate in response to the second threshold voltage being greater than the third threshold voltage.

3. The apparatus of claim 2, wherein the first source-side select gate, second source-side select gate, and at least a third source-side select gate form a plurality of source-side select gates coupled to each NAND string, the plurality of source-side select gates positioned along the NAND string between the source line and the at least one dummy word line, each of the plurality of source-side select gates having a different threshold voltage; and wherein the die controller comprises the discharge circuit configured to discharge a source-side select gate of the plurality of source-side select gates having a highest threshold voltage after discharging other source-side select gates of the plurality of source-side select gates.

4. The apparatus of claim 2, wherein the die controller is configured to program word lines of the three-dimensional memory array starting from a word line closest to the drain-side select gate and progressing in a sequence from the drain-side select gate toward the first and second source-side select gates and wherein the precharge stage comprises a source-side precharge stage.

5. The apparatus of claim 2, wherein the one or more control circuits are configured to order a discharge sequence for the at least one dummy word line and the first and second source-side select gates such that the at least one dummy word line select gate discharges before the first and second source-side select gates in response to the first and second threshold voltages being greater than the third threshold voltage and wherein a selected word line discharges before the at least one dummy word line select gate.

6. The apparatus of claim 1, wherein the three-dimensional memory array comprises:

at least one dummy word line positioned between the first and second source-side select gates of each NAND string and the word lines, the at least one dummy word line coupled to the channel of each NAND string by way of a dummy word line select gate;

wherein the dummy word line select gate has a third threshold voltage; and wherein the one or more control circuits are configured to apply a negative kick to the dummy word line select gate while concurrently discharging the at least one dummy word line select gate, the negative kick applied in response to the second threshold voltage being greater than the third threshold voltage.

7. The apparatus of claim 6, wherein the one or more control circuits are configured to program word lines of the three-dimensional memory array starting from a word line closest to the drain-side select gate and progressing in a sequence from the drain-side select gate toward the first and second source-side select gates and wherein the precharge stage comprises a source-side precharge stage.

8. An apparatus comprising:

a three-dimensional memory array of NAND strings, each NAND string coupled to a bit line;

a plurality of drain control lines connected to a drain side of each NAND string;

a plurality of source control lines connected to a source side of each NAND string;

a plurality of word lines comprising memory cells and positioned between the plurality of drain control lines and the plurality of source control lines;

a plurality of drain side dummy word lines coupled to each NAND string between the drain control lines and the word lines;

a plurality of source side dummy word lines coupled to each NAND string between the source control lines and the word lines;

a source line coupled to the source side of each NAND string; and a die controller connected to the plurality of source control lines and the plurality of source side dummy word lines, the die controller to delay discharge of one or more of the source control lines and the source side dummy word lines until after discharge of other ones of the source control lines and the source side dummy word lines during a precharge stage of a program operation, the one or more of the source control lines and the source side dummy word lines selected according to threshold voltage.

9. The apparatus of claim 8, wherein die controller is configured to program word lines of the three-dimensional memory array by programming each word line in a sequence progressing from the plurality of drain side dummy word lines toward the source side dummy word lines and wherein the die controller is configured to precharge the NAND strings using a source-side precharge stage.

10. The apparatus of claim 9, wherein the die controller comprises:

a program circuit configured to program memory cells of the selected word line;

a boosting circuit configured to boost a voltage within the NAND strings in order to inhibit programming of unselected memory cells of the selected word line; and a precharge circuit configured to implement the source-side precharge stage to raise a voltage of the NAND strings to inhibit the programming of the unselected memory cells of the selected word line, the precharge circuit comprising:

a ramping circuit configured to raise a voltage of the plurality of source control lines and the plurality of source side dummy word lines; and a discharge circuit configured to discharge the voltage of the plurality of source control lines and the plurality of source side dummy word lines such that the voltage within the NAND strings remains coupled to a bias source throughout the source-side precharge stage.

11. The apparatus of claim 10, wherein the discharge circuit is configured to discharge a particular source control line of the plurality of source control lines after discharging the other source control lines of the plurality of source control lines, the particular source control line having a higher threshold voltage than the other source control lines of the plurality of source control lines.

12. The apparatus of claim 10, wherein the plurality of source control lines have a higher threshold voltage than the threshold voltages of the plurality of source side dummy word lines and wherein the discharge circuit is configured to discharge the plurality of source control lines and the plurality of source side dummy word lines together, the discharge circuit further configured deliver a negative kick to the plurality of source side dummy word lines as the plurality of source control lines and the plurality of source side dummy word lines discharge together.

13. The apparatus of claim 10, wherein the plurality of source control lines have a higher threshold voltage than the threshold voltages of the plurality of source side dummy word lines and wherein the discharge circuit is configured to discharge the plurality of source control lines and the plurality of source side dummy word lines together and the discharge circuit is further configured to deliver a positive kick to the plurality of source control lines as the plurality of source control lines and the plurality of source side dummy word lines discharge together.

14. The apparatus of claim 13, wherein the positive kick is configured such that the plurality of source control lines keeps source-side select gates coupled to the plurality of source control lines in an on state as the plurality of source control lines and the plurality of source side dummy word lines discharge together.

15. The apparatus of claim 10, further comprising one or more control lines comprising the plurality of source control lines and the plurality of source side dummy word lines and wherein the discharge circuit comprises a timing circuit configured to order a discharge sequence for the one or more control lines such that the control lines discharge select gates in descending order of select gate threshold voltages.

16. A method for retaining a bias in a channel of a NAND string during source-side precharge, comprising:
activating each of a plurality of source-side select gates coupled to a NAND string between a source line and a plurality of source side dummy word line select gates by biasing the plurality of source-side select gates, the plurality of source side dummy word line select gates adjacent to a memory cell of the NAND string that is coupled to a word line;
activating each of the plurality of source side dummy word line select gates by biasing the plurality of source side dummy word line select gates;
biasing a channel of the NAND string by biasing the source line coupled to the NAND string by way of the plurality of source-side select gates; and
discharging the plurality of source-side select gates and the plurality of source side dummy word line select gates such that a first source-side select gate having a first threshold voltage is discharged prior to a second source-side select gate having a second threshold voltage that is higher than the first threshold voltage.

17. The method of claim 16, wherein discharging the plurality of source-side select gates and the plurality of source side dummy word line select gates comprises discharging the plurality of source-side select gates after discharging the plurality of source side dummy word line select gates.

18. The method of claim 16, wherein discharging the plurality of source-side select gates and the plurality of source side dummy word line select gates comprises discharging the plurality of source-side select gates while discharging the plurality of source side dummy word line select gates and delivering a negative kick to the plurality of source side dummy word line select gates, at least one of the plurality of source side dummy word line select gates having a higher threshold voltage than a threshold voltage for one of the plurality of source-side select gates.

19. The method of claim 16, wherein discharging the plurality of source-side select gates and the plurality of source side dummy word line select gates comprises discharging the plurality of source-side select gates while discharging the plurality of source side dummy word line select gates and delivering a positive kick to the plurality of source-side select gates, at least one of the plurality of source-side select gates having a higher threshold voltage than a threshold voltage for one of the plurality of source side dummy word line select gates.

20. The method of claim 19, wherein the at least one of the plurality of source-side select gates comprises a highest threshold voltage gate of a dominant source side transistor and wherein the positive kick is configured such that highest threshold voltage gate keeps the dominant source side transistor in an on state as the plurality of source-side select gates and the plurality of source side dummy word line select gates discharge together.

* * * * *